United States Patent
Scarbrough et al.

(10) Patent No.: US 11,721,629 B2
(45) Date of Patent: Aug. 8, 2023

(54) MEMORY DEVICE INCLUDING STAIRCASE STRUCTURE HAVING CONDUCTIVE PADS

(71) Applicant: Micron Technology, Inc., Boise, ID (US)

(72) Inventors: Alyssa N. Scarbrough, Boise, ID (US); Yiping Wang, Boise, ID (US); Jordan D. Greenlee, Boise, ID (US); John Hopkins, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 54 days.

(21) Appl. No.: 17/381,991

(22) Filed: Jul. 21, 2021

(65) Prior Publication Data

US 2023/0022792 A1 Jan. 26, 2023

(51) Int. Cl.
 *H01L 23/535* (2006.01)
 *H01L 23/522* (2006.01)
 (Continued)

(52) U.S. Cl.
 CPC ...... *H01L 23/535* (2013.01); *H01L 21/76805* (2013.01); *H01L 21/76816* (2013.01);
 (Continued)

(58) Field of Classification Search
 CPC .............. H01L 23/535; H01L 23/5226; H01L 23/5283; H01L 21/76805; H01L 21/76816;
 (Continued)

(56) References Cited

U.S. PATENT DOCUMENTS

2015/0270165 A1* 9/2015 Hyun .................. H10B 43/35
 257/329
2019/0081070 A1 3/2019 Lu et al.
 (Continued)

FOREIGN PATENT DOCUMENTS

WO WO-2023004264 A1 1/2023

OTHER PUBLICATIONS

"International Application Serial No. PCT/US2022/073774, International Search Report dated Nov. 11, 2022", 4 pgs.
 (Continued)

*Primary Examiner* — Shahed Ahmed
*Assistant Examiner* — Vicki B. Booker
(74) *Attorney, Agent, or Firm* — Schwegman Lundberg & Woessner, P.A.

(57) ABSTRACT

Some embodiments include apparatuses and methods of forming the apparatuses. One of the apparatuses includes a device including tiers of materials located one over another, the tiers of materials including respective memory cells and control gates for the memory cells. The control gates include respective portions that collectively form part of a staircase structure. The staircase structure includes first regions and second regions coupled to the first regions. The second regions include respective sidewalls in which a portion of each of the first regions and a portion of each of the second regions are part of a respective control gate of the control gates. The device also includes conductive pads electrically separated from each other and located on the first regions of the staircase structure, and conductive contacts contacting the conductive pads.

16 Claims, 41 Drawing Sheets

(51) Int. Cl.
  *H01L 23/528* (2006.01)
  *H01L 21/768* (2006.01)
  *H10B 41/27* (2023.01)
  *H10B 43/27* (2023.01)
(52) U.S. Cl.
  CPC .. *H01L 21/76877* (2013.01); *H01L 21/76895* (2013.01); *H01L 23/5226* (2013.01); *H01L 23/5283* (2013.01); *H10B 41/27* (2023.02); *H10B 43/27* (2023.02)
(58) Field of Classification Search
  CPC ........ H01L 21/76877; H01L 21/76895; H10B 41/27; H10B 43/27
  See application file for complete search history.

(56) References Cited

U.S. PATENT DOCUMENTS

| | | |
|---|---|---|
| 2019/0363006 A1 | 11/2019 | Min |
| 2019/0363014 A1 | 11/2019 | Lee et al. |
| 2020/0035553 A1 | 1/2020 | Yatsuda et al. |
| 2020/0091173 A1 | 3/2020 | Miyagawa et al. |
| 2021/0183771 A1* | 6/2021 | Lee ........................ H10B 43/27 |

OTHER PUBLICATIONS

"International Application Serial No. PCT/US2022/073774, Written Opinion dated Nov. 11, 2022", 4 pgs.

* cited by examiner

100

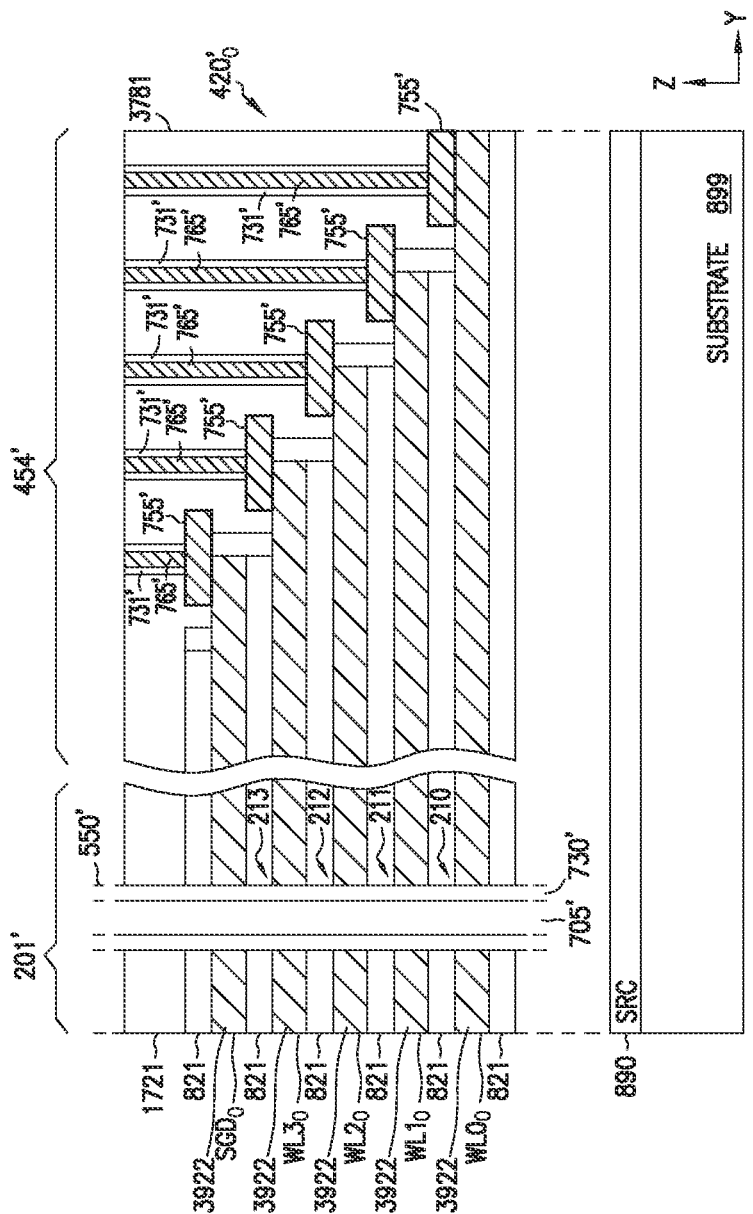

MEMORY DEVICE INCLUDING STAIRCASE STRUCTURE HAVING CONDUCTIVE PADS

TECHNICAL FIELD

Embodiments described herein relate to memory devices including staircase structures that have control gates and conductive contacts.

BACKGROUND

Memory devices are widely used in computers and many other electronic items. A memory device usually has numerous memory cells used to store information (e.g., data) and data lines to carry information (in the form of electrical signals) to and from the memory cells. The memory device has word lines (e.g., control gates) to control access to the memory cells. In some conventional memory devices, the word lines are formed one over another in a stack structure. The memory device also has conductive contacts formed on respective word lines at respective landing locations on the word lines. The conductive contacts are part of conductive paths used to provide signals to the word lines. During formation of such conductive contacts in some conventional techniques, a punch-through may occur in which a conductive contact may punch through a respective word line. Such a punch-through can lead to structural damage where adjacent word lines may be shorted to each other. This leads to defective devices, reduced yield, and cost increase.

BRIEF DESCRIPTION OF THE DRAWINGS

FIG. 35 through FIG. 41 show processes of forming a memory device including forming pillars, dielectric spacers and conductive pads at a staircase structure, and control gates of the memory device, according to some embodiments described herein.

DETAILED DESCRIPTION

The techniques described herein involve a memory device having a staircase structure formed in part from respective portions of control gates of the memory device. The control gates have respective contact landing regions. The memory device includes conductive pads formed on respective contact landing regions of the control gates. The thickness of the conductive pads is tunable to accommodate different processes associated with formation of conductive structures (e.g., conductive contacts) coupled to the control gates. The techniques described herein can provide improved margin for the contact landing regions. Therefore, undesirable events such as punch-through can be reduced or eliminated in the processes of forming the memory devices described herein. Other improvements and benefits of the techniques described herein are further discussed below with reference to FIG. 1 through FIG. 41.

Figure 1:
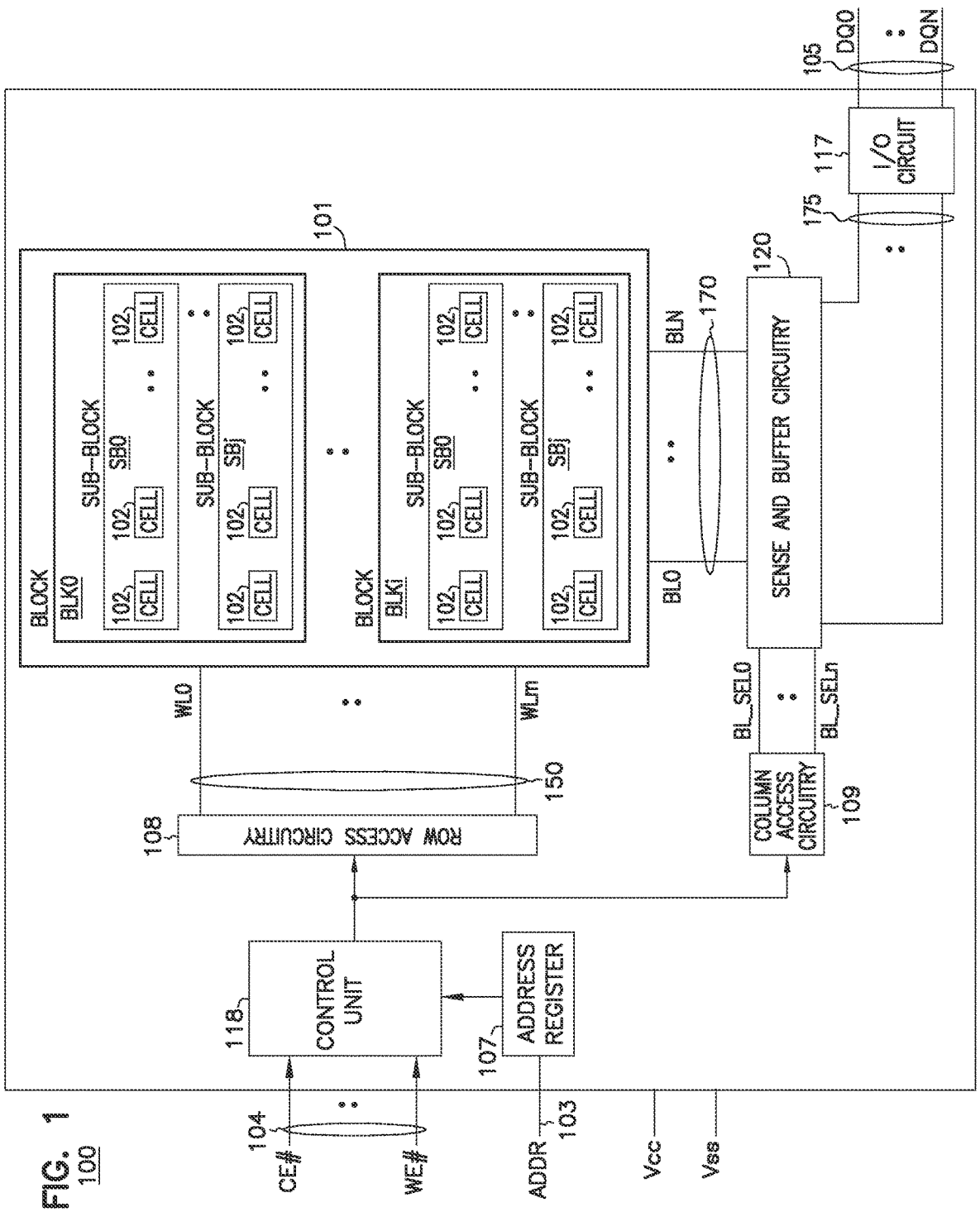
FIG. 1 shows a block diagram of an apparatus in the form of a memory device, according to some embodiments described herein.

FIG. 1 shows a block diagram of an apparatus in the form of a memory device 100, according to some embodiments described herein. Memory device 100 can include a memory array (or multiple memory arrays) 101 containing memory cells 102 arranged in blocks (blocks of memory cells), such as blocks BLK0 through BLKi. Each of blocks BLK0 through BLKi can include its own sub-blocks, such as sub-blocks SB0 through SBj. A sub-block is a portion of a block. In the physical structure of memory device 100, memory cells 102 can be arranged vertically (e.g., stacked one over another) over a substrate (e.g., a semiconductor substrate) of memory device 100.

As shown in FIG. 1, memory device 100 can include access lines (which can include word lines) 150 and data lines (which can include bit lines) 170. Access lines 150 can carry signals (e.g., word line signals) WL0 through WLm. Data lines 170 can carry signals (e.g., bit line signals) BL0 through BLn. Memory device 100 can use access lines 150 to selectively access memory cells 102 of blocks BLK0 through BLKi and data lines 170 to selectively exchange information (e.g., data) with memory cells 102 of blocks BLK0 through BLKi. Data lines can be shared among blocks BLK0 through BLKi.

Memory device 100 can include an address register 107 to receive address information (e.g., address signals) ADDR on lines (e.g., address lines) 103. Memory device 100 can include row access circuitry 108 and column access circuitry 109 that can decode address information from address register 107. Based on decoded address information, memory device 100 can determine which memory cells 102 of which sub-blocks of blocks BLK0 through BLKi are to be accessed during a memory operation. Memory device 100 can perform a read operation to read (e.g., sense) information (e.g., previously stored information) from memory cells 102 of blocks BLK0 through BLKi, or a write (e.g., programming) operation to store (e.g., program) information in memory cells 102 of blocks BLK0 through BLKi. Memory device 100 can use data lines 170 associated with signals BL0 through BLn to provide information to be stored in memory cells 102 or obtain information read (e.g., sensed) from memory cells 102. Memory device 100 can also perform an erase operation to erase information from some or all of memory cells 102 of blocks BLK0 through BLKi.

Memory device 100 can include a control unit 118 that can be configured to control memory operations of memory device 100 based on control signals on lines 104. Examples of the control signals on lines 104 include one or more clock signals and other signals (e.g., a chip enable signal CE#, a write enable signal WE#) to indicate which operation (e.g., read, write, or erase operation) memory device 100 can perform. Other devices external to memory device 100 (e.g., a memory controller or a processor) may control the values of the control signals on lines 104. Specific values of a combination of the signals on lines 104 may produce a command (e.g., read, write, or erase command) that causes memory device 100 to perform a corresponding memory operation (e.g., read, write, or erase operation).

Memory device 100 can include sense and buffer circuitry 120 that can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 102 (e.g., during a read operation) of blocks BLK0 through BLKi and provide the value of the information to lines (e.g., global data lines) 175. Sense and buffer circuitry 120 can also be configured to use signals on lines 175 to determine the value of information to be stored (e.g., programmed) in memory cells 102 of blocks BLK0 through BLKi (e.g., during a write operation) based on the values (e.g., voltage values) of signals on lines 175 (e.g., during a write operation).

Memory device 100 can include input/output (I/O) circuitry 117 to exchange information between memory cells 102 of blocks BLK0 through BLKi and lines (e.g., I/O lines) 105. Signals DQ0 through DQN on lines 105 can represent information read from or stored in memory cells 102 of blocks BLK0 through BLKi. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

Each of memory cells 102 can be programmed to store information representing a value of at most one bit (e.g., a single bit), or a value of multiple bits such as two, three, four, or another number of bits. For example, each of memory cells 102 can be programmed to store information representing a binary value "0" or "1" of a single bit. The single bit per cell is sometimes called a single-level cell. In another example, each of memory cells 102 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits (e.g., more than three bits in each memory cell). A cell that has the ability to store multiple bits is sometimes called a multi-level cell (or multi-state cell).

Memory device 100 can include a non-volatile memory device, and memory cells 102 can include non-volatile memory cells, such that memory cells 102 can retain information stored thereon when power (e.g., voltage Vcc, Vss, or both) is disconnected from memory device 100. For example, memory device 100 can be a flash memory device, such as a NAND flash (e.g., 3D NAND) or a NOR flash memory device, or another kind of memory device, such as a variable resistance memory device (e.g., a phase change memory device or a resistive Random Access Memory (RAM) device).

One of ordinary skill in the art may recognize that memory device 100 may include other components, several of which are not shown in FIG. 1 so as not to obscure the example embodiments described herein. At least a portion of memory device 100 can include structures and perform operations similar to or identical to the structures and operations of any of the memory devices described below with reference to FIG. 2 through FIG. 41.

Figure 2:
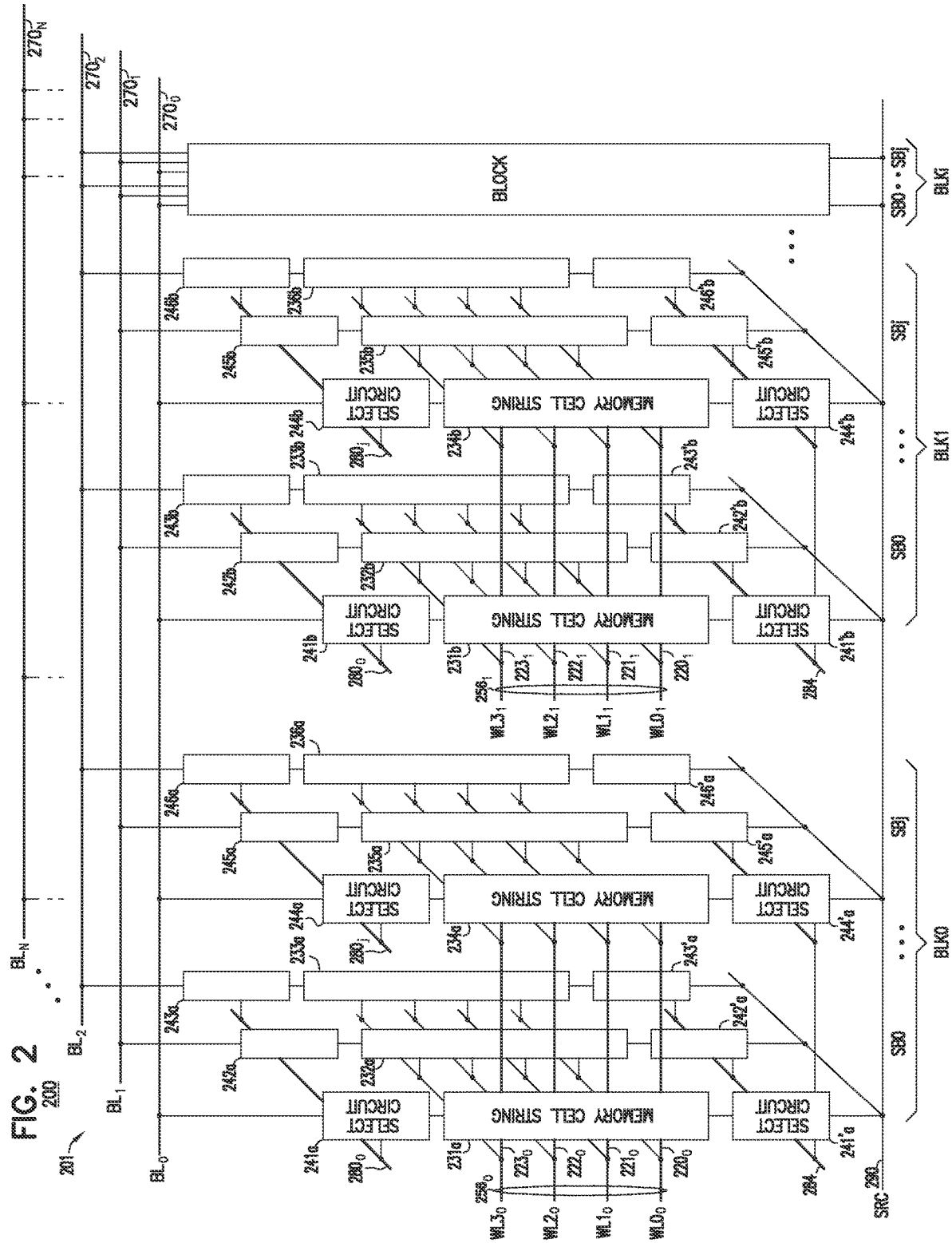
FIG. 2 shows a general schematic diagram of a portion of a memory device including a memory array having blocks (blocks of memory cells) and sub-blocks in each of the blocks, according to some embodiments described herein.

FIG. 2 shows a general schematic diagram of a portion of a memory device 200 including a memory array 201 having blocks (blocks of memory cells) BLK0 through BLKi and sub-blocks SB0 through SBj in each of the blocks, according to some embodiments described herein. Memory device 200 can correspond to memory device 100 of FIG. 1. For example, memory array 201 can form part of memory array 101 of FIG. 1.

As shown in FIG. 2, each sub-block (e.g., SB0 or SBj) has its own memory cell strings that can be associated with (e.g., coupled to) respective select circuits. The sub-blocks of the blocks (e.g., blocks BLK0 through BLKi) of memory device 200 can have the same number of memory cell strings and associated select circuits. For example, sub-block SB0 of block BLK0 has memory cell strings 231a, 232a, and 233a and associated select circuits (e.g., drain select circuits) 241a, 242a, and 243a, respectively, and select circuits (e.g., source select circuits) 241'a, 242'a, and 243'a, respectively. In another example, sub-block SBj of block BLK0 has memory cell strings 234a, 235a, and 236a and associated select circuits (e.g., drain select circuits) 244a, 245a, and 246a, respectively, and select circuits (e.g., source select circuits) 244'a, 245'a, and 246'a, respectively.

Similarly, sub-block SB0 of block BLK1 has memory cell strings 231b, 232b, and 233b, and associated select circuits (e.g., drain select circuits) 241b, 242b, and 243b, respectively, and select circuits (e.g., source select circuits) 241'b, 242'b, and 243'b, respectively. Sub-block SBj of block BLK1 has memory cell strings 234b, 235b, and 236b, and associated select circuits (e.g., drain select circuits) 244b, 245b, and 246b, respectively, and select circuits (e.g., source select circuits) 244'b, 245'b, and 246'b, respectively.

FIG. 2 shows an example of three memory cell strings and their associated circuits in a sub-block (e.g., in sub-block SB0). The number of memory cell strings and their associated select circuits in each sub-block of blocks BLK0 through BLKi can vary. Each of the memory cell strings of memory device 200 can include series-connected memory cells (shown in detail in FIG. 3 and FIG. 4) and a pillar (e.g., pillar 550 in FIG. 5) where the series-connected memory cells can be located (e.g., vertically located) along respective portion of the pillar.

As shown in FIG. 2, memory device 200 can include data lines $270_0$ through $270_N$ that carry signals $BL_0$ through $BL_N$, respectively. Each of data lines $270_0$ through $270_N$ can be structured as a conductive line that can include conductive materials (e.g., conductively doped polycrystalline silicon (doped polysilicon), metals, or other conductive materials).

The memory cell strings of blocks BLK0 through BLKi can share data lines $270_0$ through $270_N$ to carry information (in the form of signals) read from or to be stored in memory cells of selected memory cells (e.g., selected memory cells in block BLK0 or BLK1) of memory device 200. For example, memory cell strings 231a, 234a (of block BLK0), 231b and 234b (of block BLK1) can share data line $270_0$. Memory cell strings 232a, 235a (of block BLK0), 232b and 235b (of block BLK1) can share data line $270_1$. Memory cell strings 233a, 236a (of block BLK0), 233b and 236b (of block BLK1) can share data line $270_2$.

Memory device 200 can include a source (e.g., a source line, a source plate, or a source region) 290 that can carry a signal (e.g., a source line signal) SRC. Source 290 can be structured as a conductive line or a conductive plate (e.g., conductive region) of memory device 200. Source 290 can be common source (e.g., common source plate or common source region) of blocks BLK0 through BLKi. Alternatively, each of blocks BLK0 through BLKi can have its own source similar to source 290. Source 290 can be coupled to a ground connection of memory device 200.

Each of blocks BLK0 through BLKi can have its own group of control gates for controlling access to memory cells of the memory cell strings of the sub-block of a respective block. As shown in FIG. 2, memory device 200 can include control gates (e.g., word lines) $220_0$, $221_0$, $222_0$, and $223_0$ in block BLK0 that can be part of conductive paths (e.g., access lines) $256_0$ of memory device 200. Memory device 200 can include control gates (e.g., word lines) $220_1$, $221_2$, $222_1$, and $223_1$ in block BLK1 that can be part of other conductive paths (e.g., access lines) $256_1$ of memory device 200. Conductive paths $256_0$ and $256_1$ can correspond to part of access lines 150 of memory device 100 of FIG. 1.

As shown in FIG. 2, control gates $220_0$, $221_0$, $222_0$, and $223_0$ can be electrically separated from each other. Control gates $220_1$, $221_2$, $222_1$, and $223_1$ can be electrically separated from each other. Control gates $220_0$, $221_0$, $222_0$, and $223_0$ can be electrically separated from control gates $220_1$, $221_2$, $222_1$, and $223_1$. Thus, blocks BLK0 through BLKi can be accessed separately (e.g., accessed one at a time).

FIG. 2 shows memory device 200 including four control gates in each of blocks BLK0 through BLKi as an example. The number of control gates of the blocks (e.g., blocks BLK0 through BLKi) of memory device 200 can be different from four. For example, each of blocks BLK0 through BLKi can include up to hundreds (or more) of control gates.

Each of control gates $220_0$, $221_0$, $222_0$, and $223_0$ can be part of a structure (e.g., a level) of a conductive material (e.g., a layer of conductive material) located in a level of memory device 200. Control gates $220_0$, $221_0$, $222_0$, and $223_0$ can carry corresponding signals (e.g., word line signals) $WL0_0$, $WL1_0$, $WL2_0$, and $WL3_0$. Memory device 200 can use signals $WL0_0$, $WL1_0$, $WL2_0$, and $WL3_0$ to selectively control access to memory cells of block BLK0 during an operation (e.g., read, write, or erase operation).

Each of control gates $220_1$, $221_2$, $222_1$, and $223_1$ can be part of a structure (e.g., a level) of a conductive material (e.g., a layer of conductive material) located in a level of memory device 200. Control gates $220_1$, $221_2$, $222_1$, and $223_1$ can carry corresponding signals (e.g., word line signals) $WL0_0$, $WL1_0$, $WL2_0$, and $WL3_0$. Memory device 200 can use signals $WL0_1$, $WL1_1$, $WL2_1$, and $WL3_1$ to selectively control access to memory cells of block BLK0 during an operation (e.g., read, write, or erase operation).

As shown in FIG. 2, in sub-block SB0 of block BLK0, memory device 200 can include a select line (e.g., drain select line) $280_0$ that can be shared by select circuits 241a, 242a, and 243a. In sub-block SBj of block BLK0, memory device 200 can include a select line (e.g., drain select line) $280_j$ that can be shared by select circuits 244a, 245a, and 246a. Block BLK0 can include a select line (e.g., source select line) 284 that can be shared by select circuits 241'a, 242'a, 243'a, 244'a, 245'a, and 246'a.

In sub-block SB0 of block BLK1, memory device 200 can include a select line (e.g., drain select line) $280_0$, which is electrically separated from select line $280_0$ of block BLK1. Select line $280_0$ of block BLK1 can be shared by select circuits 241b, 242b, and 243b. In sub-block SBj of block BLK1, memory device 200 can include a select line (e.g., drain select line) $280_j$ that can be shared by select circuits 244b, 245b, and 246b. Select lines $280_0$ and $280_j$ of block BLK1 are electrically separated from select lines $280_0$ and $280_j$ of block BLK0. Block BLK1 can include a select line (e.g., source select line) 284 that can be shared by select circuits 241'b, 242'b, 243'b, 244'b, 245'b, and 246'b.

FIG. 2 shows an example where memory device 200 includes one drain select line (e.g., select line $280_0$) shared by select circuits (e.g., select circuits 241a, 242a, or 243a) in a sub-block (e.g., sub-block SB0 of block BLK0). However, memory device 200 can include multiple drain select lines shared by select circuits in a sub-block. FIG. 2 shows an example where memory device 200 includes one source select line (e.g., select line 284) associated shared by source select circuits (e.g., select circuits 241'a, 242'a, or 243'a) in a sub-block (e.g., sub-block SB0 of block BLK0). However, memory device 200 can include multiple source select lines shared by source select circuits in a sub-block.

In FIG. 2, each of the drain select circuits of memory device 200 can include a drain select gate (e.g., a transistor, shown in FIG. 3) between a respective data line and a respective memory cell string. The drain select gate (e.g., transistor) can be controlled (e.g., turned on or turned off) by a signal on the respective drain select line based on voltages provided to the signal.

In FIG. 2, each of the source select circuits of memory device 200 can include a source select gate (e.g., a transistor, shown in FIG. 3) coupled between source 290 and a respective memory cell string. The source select gate (e.g., transistor) can be controlled (e.g., turned on or turned off) by a signal on a respective source select line based on a voltage provided to the signal.

Figure 3:
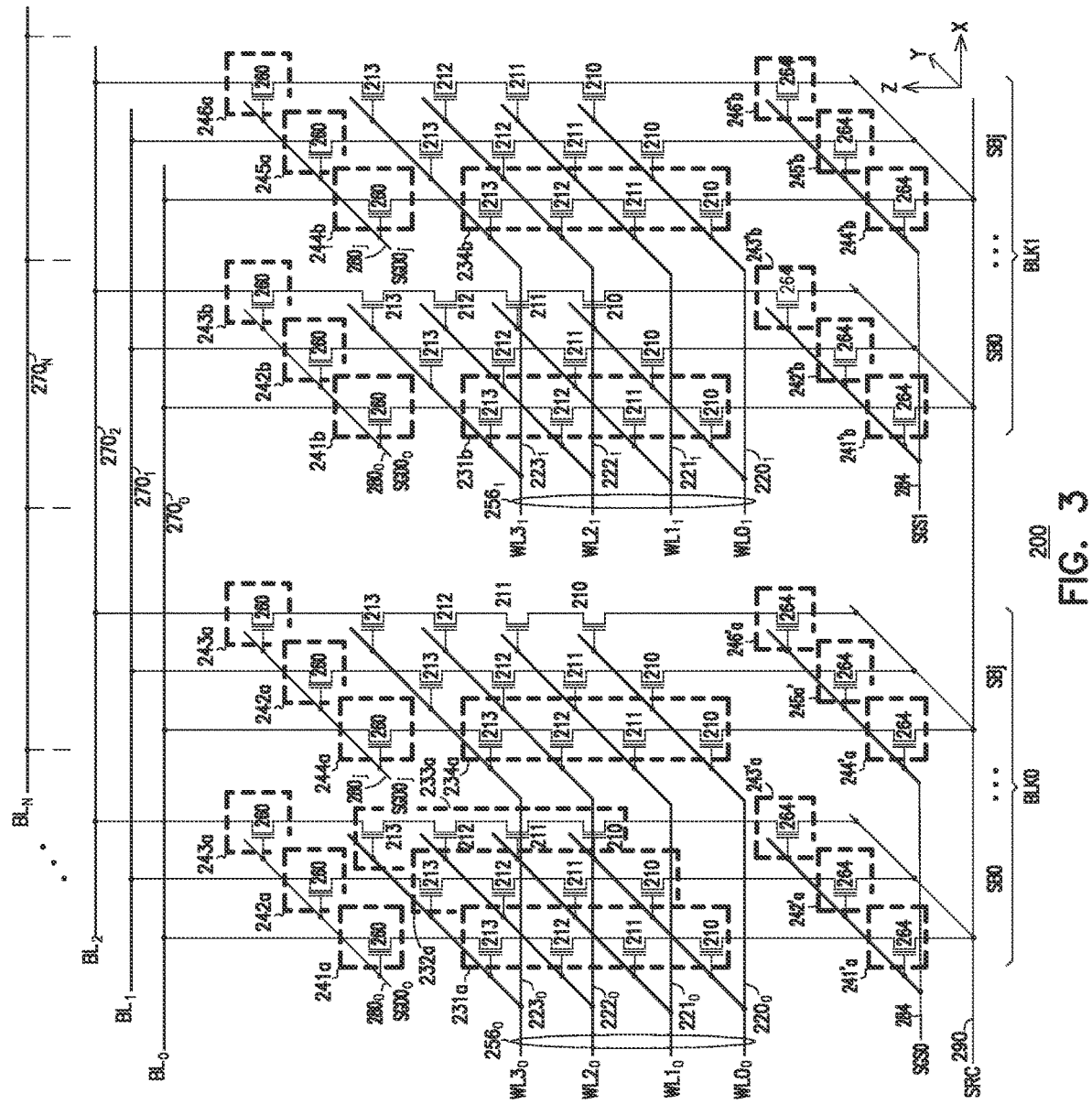
FIG. 3 shows a detailed schematic diagram of two blocks of the memory device of FIG. 2, according to some embodiments described herein.

FIG. 3 shows a detailed schematic diagram including blocks of the blocks BLK0 and BLK1 of memory device 200 of FIG. 2, according to some embodiments described herein. In FIG. 3, directions X, Y, and Z in FIG. 3 can be relative to the physical directions (e.g., three dimensional (3D) dimensions) of the structure of memory device 200. For example, the Z-direction can be a direction perpendicular to (e.g., vertical direction with respect to) a substrate of memory device 200 (e.g., a substrate 599 shown in FIG. 5). The Z-direction is perpendicular to the X-direction and Y-direction (e.g., the Z-direction is perpendicular to an X-Y plane of memory device 200).

For simplicity, only some of the memory cell strings and some of the select circuits of memory device 200 of FIG. 2 are labeled in FIG. 3. As shown in FIG. 3, each select line can carry an associated separate select signal. For example, in sub-block SB0 of block BLK0, select line (e.g., drain select line) $280_0$ can carry signal (e.g., drain select-gate signal) $SGD0_0$. In sub-block SBj of block BLK0, select line (e.g., drain select line) $280_j$ can carry signal (e.g., drain select-gate signal) SGD0$_j$. Sub-blocks SB0 and SBj of block BLK0 can share select line 284 that can carry signal (e.g., source select-gate signal) SGS0.

In sub-block SB0 of block BLK1, select line (e.g., drain select line) 280$_0$ can carry signal (e.g., drain select-gate signal) SGD0$_0$. In sub-block SBj of block BLK1, select line (e.g., drain select line) 28, can carry signal (e.g., drain select-gate signal) SGD0$_j$. Sub-blocks SB0 and SBj of block BLK1 can share select line 284 that can carry signal (e.g., source select-gate signal) SGS1.

For simplicity, similar or the same elements in the memory devices (e.g., memory device 200) described herein are given the same label. For example, as shown in FIG. 3, similar drain select lines (and their associated signals) are given the same labels for simplicity. However, as shown in FIG. 3, the drain select lines (from the same block or from different blocks) of memory device 200 are electrically separated from each other and carry different signals (although the signals are given the same labels).

As shown in FIG. 3, memory device 200 can include memory cells 210, 211, 212, and 213; select gates (e.g., drain select gates or transistors) 260; and select gates (e.g., source select gates) 264 that can be physically arranged in three dimensions (3D), such as X, Y, and Z directions (e.g., dimensions), with respect to the structure (shown in FIG. 4) of memory device 200.

In FIG. 3, each of the memory cell strings (e.g., memory cell string 231a) of memory device 200 can include series-connected memory cells that include one of memory cells 210, one of memory cells 211, one of memory cells 212, and one of memory cells 213. FIG. 3 shows an example of four memory cells 210, 211, 212, and 213 in each memory cell string. The number of memory cells in each memory cell string can vary. For example, each memory string can include up to hundreds (or more) of memory cells.

As shown in FIG. 3, each drain select circuit (e.g., select circuit 241a) can include one of select gates 260. Each source select circuit (e.g., select circuit 241'a) can include one of select gates 264.

Each of select gates 260 in FIG. 3 can operate like a transistor. For example, select gate 260 of select circuit 241a can operate like a field effect transistor (FET), such as a metal-oxide semiconductor FET (MOSFET). An example of such a MOSFET include an n-channel MOS (NMOS) transistor.

A select line (e.g., select line 280$_0$ of sub-block SB0 of block BLK0) can carry a signal (e.g., signal SGD0$_0$) but it does not operate like a switch (e.g., a transistor). A select gate (e.g., select gate 260 of select circuit 241a) can receive a signal (e.g., signal SGD0$_0$) from a respective select line (e.g., select line 280$_0$ of sub-block SB0 of block BLK0) and can operate like a switch (e.g., a transistor).

In the physical structure of memory device 200, a select line (e.g., select line 280$_0$ of sub-block SB0 of block BLK0) can be a structure (e.g., a level) of a conductive material (e.g., a layer (e.g., a piece) or a region of conductive material) located in a single level of memory device 200. The conductive material can include metal, doped polysilicon, or other conductive materials.

In the physical structure of memory device 200, a select gate (e.g., select gate 260 of select circuit 241a of sub-block SB0 of block BLK0) can include (can be formed from) a portion of the conductive material of a respective select line (e.g., select line 280$_0$ of sub-block SB0 of block BLK0), a portion of a channel material (e.g., polysilicon channel), and a portion of a dielectric material (e.g., similar to a gate oxide of a transistor (e.g., FET)) between the portion of the conductive material and the portion of the channel material.

FIG. 3 shows an example where memory device 200 includes one drain select gate (e.g., select gate 260) in each drain select circuit, and one source select gate (e.g., select gate 264) in each source select circuit coupled to a memory cell string. However, memory device 200 can include multiple drain select gates (e.g., multiple select gates 260 connected in series) in each drain select circuit, multiple source select gates (e.g., multiple select gates 264 connected in series) in each source select circuit, or both multiple drain select gates and multiple source select gates coupled to a memory cell string.

Figure 4:
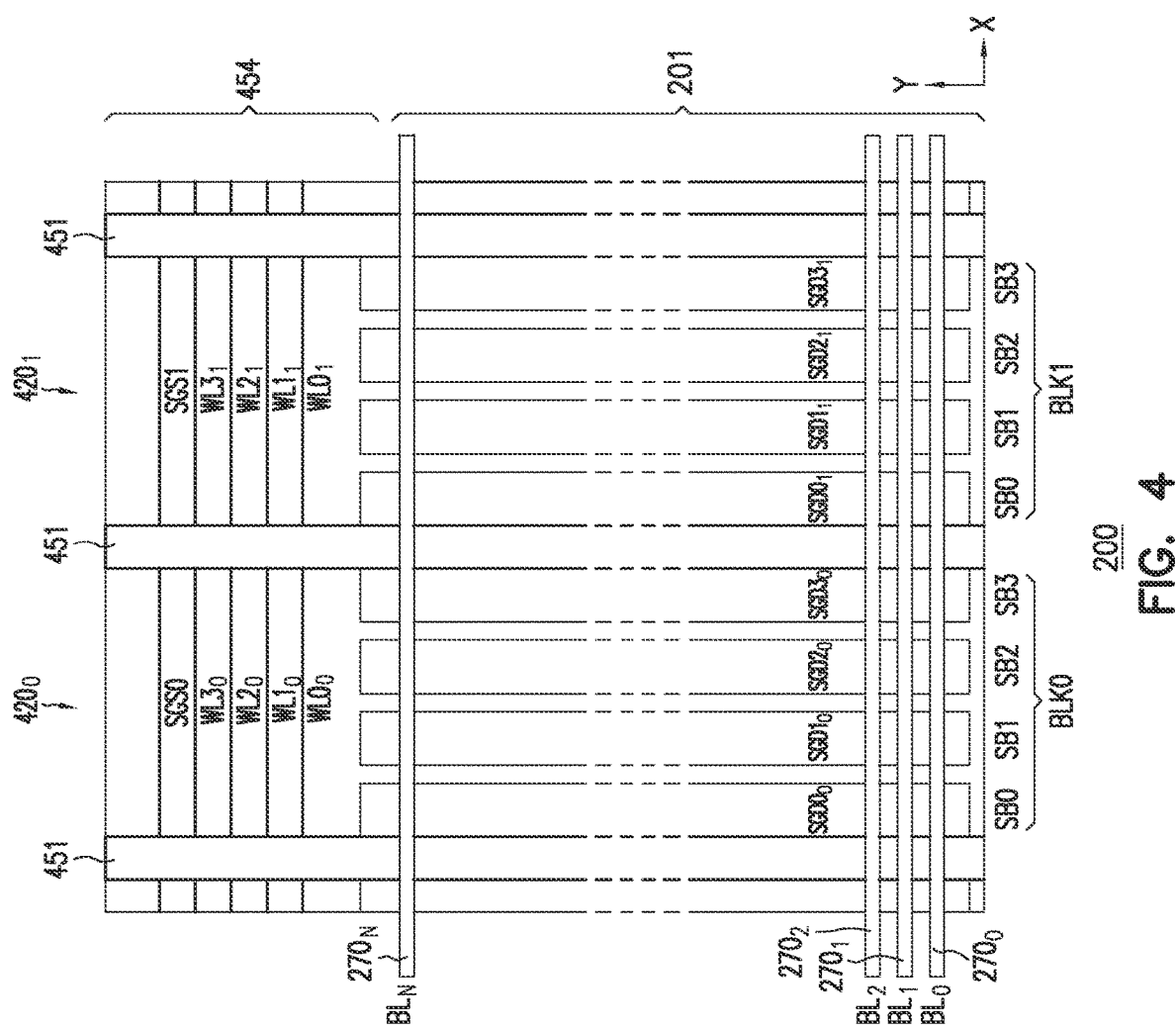
FIG. 4 shows a top view of a structure of a portion of the memory device of FIG. 3 including a region of a memory array, a staircase region, and dielectric structures between the blocks of the memory device, according to some embodiments described herein.

FIG. 4 shows a top view of a structure of a portion of memory device 200 of FIG. 2 and FIG. 3 including a region of a memory array 201 including blocks BLK0 and BLK1, staircase region 454, and dielectric structures 451 between blocks, according to some embodiments described herein. For simplicity, some elements of memory device 200 (and other memory devices described herein) may be omitted from a particular figure of the drawings so as not to obscure the view or the description of the element (or elements) being described in that particular figure. Also for simplicity, cross-sectional lines (e.g., hatch lines) are omitted from some or all the elements shown in the drawings described herein. Some elements of memory device 200 may be omitted from a particular figure of the drawings so as not to obscure the view or the description of the element (or elements) being described in that particular figure. Further, the dimensions (e.g., physical structures) of the elements of memory device 200 (and other memory devices) in the drawings described herein are not scaled. Moreover, the description of the same elements of memory device 200 described above with reference to FIG. 2 and FIG. 3 are also not repeated.

As shown in FIG. 4, blocks BLK0 and BLK1 have separate control gates. The control gates (associated with signals WL0$_0$, WL1$_0$, WL2$_0$, WL3$_0$) of block BLK0 have a length in the Y-direction from memory array 201 of memory device 200 to staircase region 454 (shown in detail in FIG. 7) of memory device. The control gates of block BLK0 can be stacked one over another in the Z-direction (shown in a side view in FIG. 5). As shown in FIG. 4, select line (associated with signal SGS0) of block BLK0 can located under (with respect to the Z-direction) the control gates of block BLK0.

Block BLK0 can include a staircase structure 420$_0$ at staircase region 454 of memory device 200. Staircase structure 420$_0$ can be formed from portions (e.g., end portions) of the control gates (associated with signals WL0$_0$, WL1$_0$, WL2$_0$, WL3$_0$) of block BLK0. Similarly, block BLK0 can include a staircase structure 420$_1$ at staircase region 454 of memory device 200. Staircase structure 420$_1$ can be formed from portions (e.g., end portions) of the control gates (associated with signals WL0$_1$, WL1$_1$, WL2$_1$, WL3$_1$) of block BLK1.

As shown in FIG. 4, block BLK0 can include sub-blocks (e.g., four sub-blocks) SB0, SB1, SB2, and SB3 and select lines (e.g., four drain select lines) associated with signals SGD0$_0$, SGD1$_0$, SGD2$_0$, and SGD3$_0$, respectively. The select lines can include respective conductive regions (e.g., conductive materials) that are electrically separated from each other and can be located on the same level (with respect to the Z-direction) and over (with respect to the Z-direction) the control gates of block BLK0. As shown in FIG. 4, each of the select lines (associated with signals SGD0$_0$, SGD1$_0$, SGD2$_0$, and SGD3$_0$) can have length in the Y-direction from memory array 201 to staircase region 454. FIG. 4 shows an example where each block of memory device 200 can have four sub-blocks SB0, SB1, SB2, and SB3. However, the number of sub-blocks can be different from four.

Block BLK1 can have structure like block BLK0. As shown in FIG. 4, block BLK1 can include control gates associated with signals $WL0_1$, $WL1_1$, $WL2_1$, and $WL3_1$ (also shown in FIG. 3), select line (e.g., source select line) associated with signal SGS1 (also shown in FIG. 3), sub-blocks SB0, SB1, SB2, and SB3, select lines (e.g., drain select lines) $SGD0_1$, $SGD1_1$, $SGD2_1$, and $SGD3_1$, and a staircase structure $420_1$.

Figure 7:
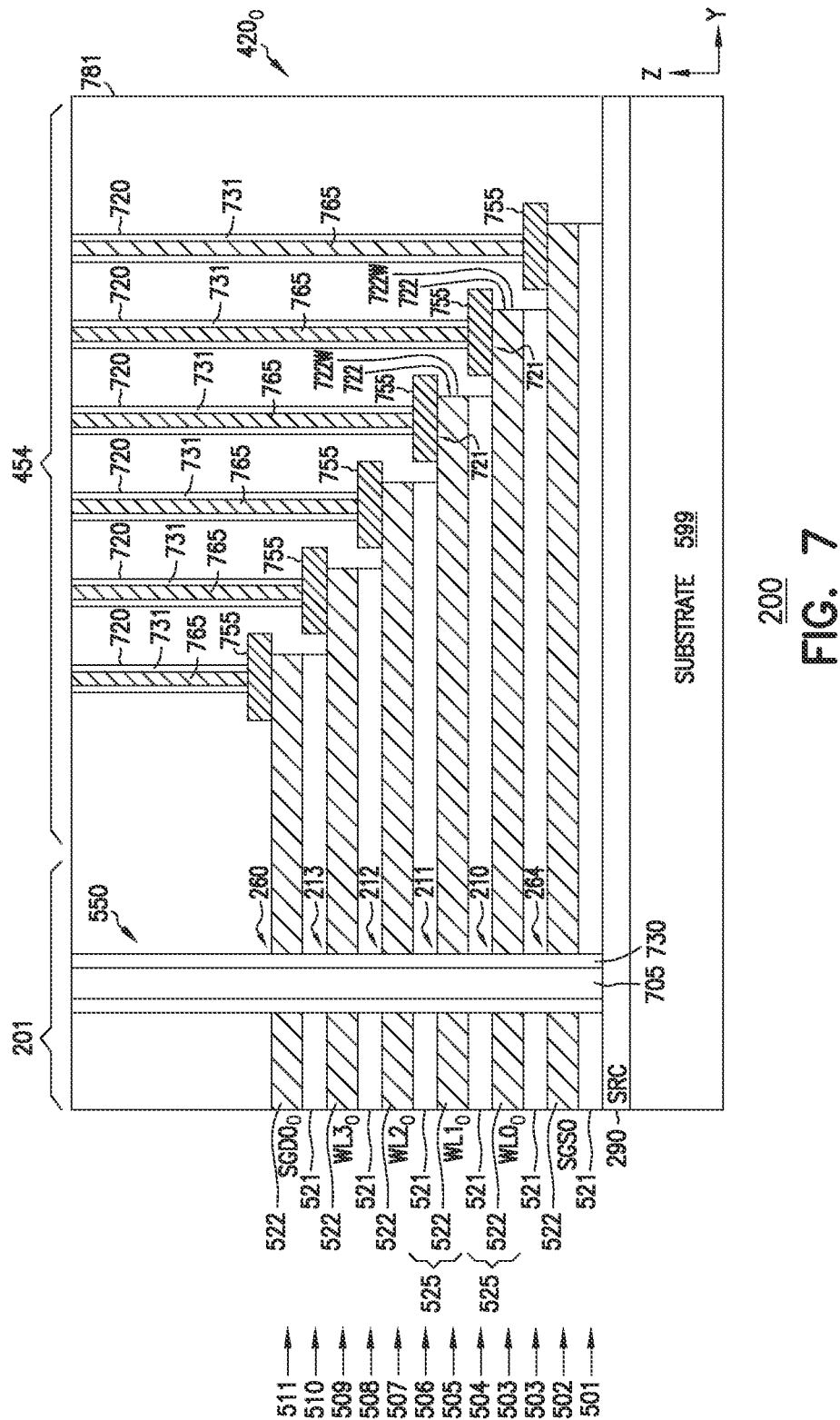
FIG. 7 shows a side view of a portion of the memory device of FIG. 6, including a portion of a staircase structure in a staircase region, and a pillar in a memory array, according to some embodiments described herein.

Although not shown in FIG. 4, memory device 200 can include conductive pads and conductive contacts at staircase structure $420_0$ to allow signals (e.g., signals $WL0_0$, $WL1_0$, $WL2_0$, and $WL3_0$ in block BLK0) to be provided to respective control gates of block BLK0 through the conductive contacts and the conductive pads at staircase structure $420_0$. FIG. 7 (described in more detail below) show conductive pads 755 and conductive contacts 765 at staircase structure $420_0$ of block BLK0.

Similarly, conductive contacts (e.g., word line contacts, not shown in FIG. 4) can be formed at staircase structure $420_1$ to allow signals (e.g., signals $WL0_1$, $WL1_1$, $WL2_1$, and $WL3_1$ in block BLK1) to be provided to respective control gates of block BLK1 through the conductive contacts at staircase structure $420_1$.

Figure 5:
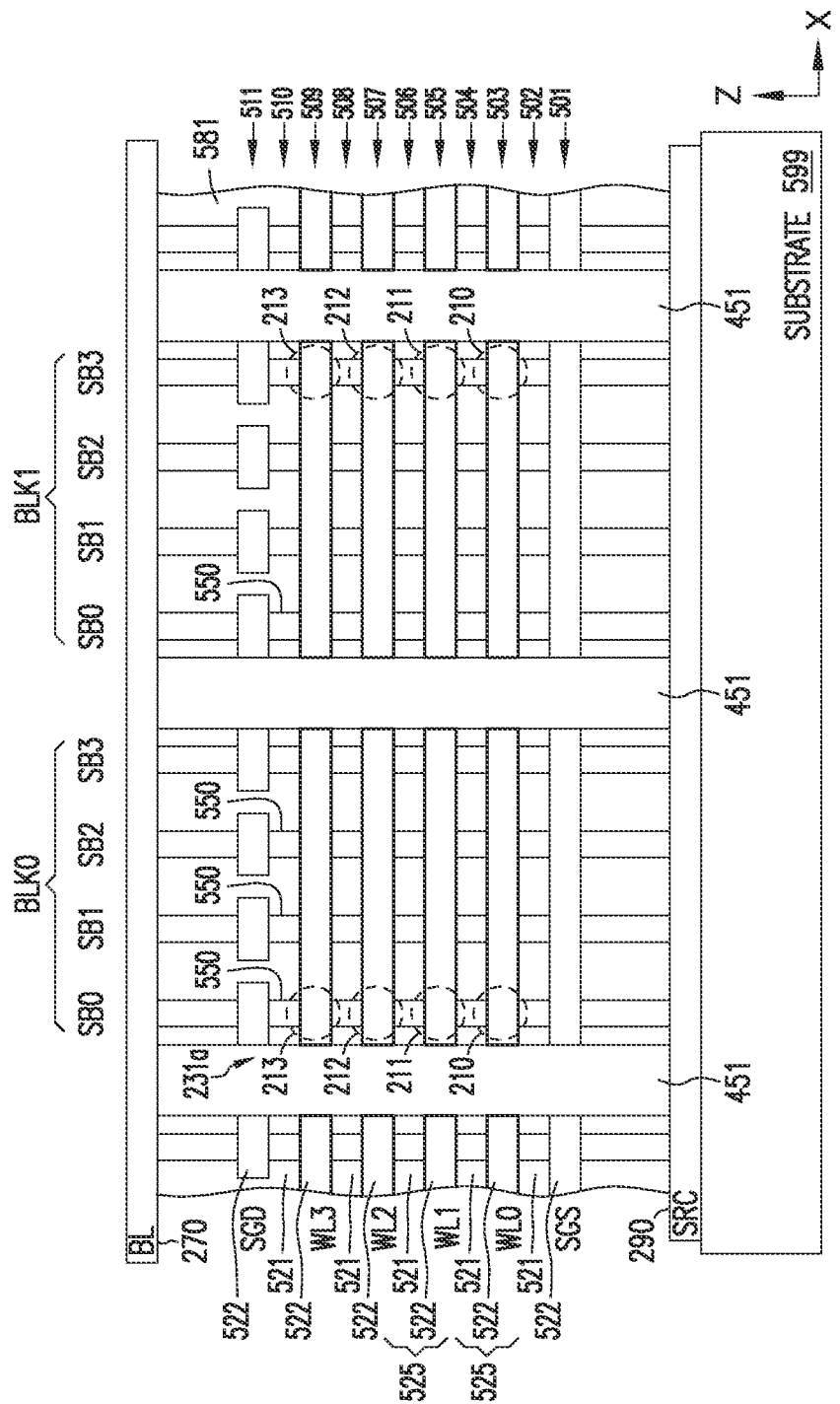
FIG. 5 shows a side view (e.g., cross-section) of a structure of a portion of the memory device of FIG. 4, including tiers of materials that include respective memory cells and control gates for the memory cells, according to some embodiments described herein.

FIG. 5 shows a side view (e.g., cross-section) of a structure of a portion of memory device 200 of FIG. 4 including tiers (tiers of materials) 525 that include respective memory cells and control gates for the memory cells, according to some embodiments described herein. FIG. 5 also partially shows other blocks (on the left and right sides of blocks BLK0 and BLK1) of memory device 200.

As shown in FIG. 5, memory device 200 can include a substrate 599, source 290 formed over substrate 599, and different levels 501 through 511 (which are physical device levels of memory device 200) over substrate 599 in the Z-direction. Memory cells 210, 211, 212, and 213 of the memory cell strings (e.g., memory cell string 231a in FIG. 3) of respective sub-blocks SB0, SB1, SB3, and SB3 of each of blocks BLK0 and BLK1 can be formed over substrate 599 and source 290 (e.g., formed vertically in Z-direction in respective levels among levels 501 through 511).

In FIG. 5, a data line 270 can be one of data lines $270_0$ through $270_N$ in FIG. 4. Signal BL can be one of signals $BL_0$ through $BL_N$ in FIG. 4.

In FIG. 5, the select lines (e.g., four drain select lines) indicated by signal SGD can correspond to respective select lines of a respective block of blocks BLK0 and BLK1. For example, in sub-blocks SB0, SB1, SB2, and SB3 of block BLK0, the select lines (e.g., four drain select lines) indicated by signal SGD can correspond to respective select lines associated with signals $SGD0_0$, $SGD1_0$, $SGD2_0$, and $SGD3_0$ of block BLK0 shown in FIG. 4. In another example, in sub-blocks SB0, SB1, SB2, and SB3 of block BLK1, the select lines (e.g., four drain select lines) indicated by signal SGD can correspond to respective select lines associated with signals $SGD0_1$, $SGD1_1$, $SGD2_1$, and $SGD3_1$ of block BLK1 shown in FIG. 4.

As shown in FIG. 5, the select lines (e.g., four drain select lines) in the same block (e.g., block BLK0) can include respective conductive regions (e.g., four conductive regions) that are electrically separated from each other and can be located on the same level (e.g., level 511) in the Z-direction of memory device 200 and located over the control gates (in the Z-direction) of the respective block.

The select lines (e.g., source select lines) indicated by signal SGS (on level 501) can correspond to respective select lines of blocks BLK0 and BLK1. For example, in block BLK0, the select line indicated by signal SGS can correspond to the select line (e.g., source select line) associated with signals SGS0 of block BLK0 shown in FIG. 4. In another example, in block BLK1, the select line indicated by signal SGS can correspond to the select line (e.g., source select line) associated with signals SGS1 of block BLK1 shown in FIG. 4.

In FIG. 5, for simplicity, control gates (e.g., four control gates) of blocks BLK0 and BLK1 are indicated by the same signals WL0, WL1, WL2, and WL3. For example, in block BLK0, the control gates indicated by signals WL0, WL1, WL2, and WL3 can correspond to respective control gates associated with signals $WL0_0$, $WL1_0$, $WL2_0$, and $WL3_0$, respectively, of block BLK0 shown in FIG. 4. In another example, in block BLK1 in FIG. 5, the control gates indicated by signals WL0, WL1, WL2, and WL3 can correspond to respective control gates associated with signals $WL0_1$, $WL1_1$, $WL2_1$, and $WL3_1$, respectively, of block BLK1 shown in FIG. 4.

Memory device 200 can include dielectric materials (e.g., silicon dioxide) 521 located on levels 502, 504, 506, 508, and 510. Dielectric materials 521 in a respective block are interleaved with conductive materials 522. Conductive materials 522 can form respective control gates (associated with signals WL0, WL1, WL2, and WL3) in the respective block. As shown in FIG. 5, dielectric materials 521 can be located on respective levels among levels 501 through 511. Conductive materials 522 can be located on respective levels among levels 501 through 511 that are interleaved with the levels of dielectric materials 521. Examples of conductive materials 522 (which form the control gates) include a single conductive material (e.g., single metal (e.g., tungsten)) or a combination of different layers of conductive materials. For example, each of the control gates of blocks BLK0 and BLK1 can include (e.g., multi-layers of) aluminum oxide, titanium nitride, and tungsten.

The levels of dielectric material 521 and the levels of conductive materials 522 can form tiers 525 of memory device 200. Each tier 525 can include a level of dielectric material 521 and a level of conductive material 522. For simplicity, only some of tiers 525 are labeled in FIG. 5. As shown in FIG. 5, tiers 525 can be located one over another and can include respective levels of memory cells 210, 211, 212, and 213, and control gates associated with the memory cells.

As shown in FIG. 5, memory device 200 can include pillars (memory cell pillars) 550 in blocks BL0 and BLK1. Each of pillars 550 can be part of a respective memory cell string (e.g., memory cell string 231a). Each of pillars 550 can have length extending outwardly (e.g., extending vertically in the direction of the Z-direction) from substrate 599 between substrate 599 and data line 270.

As shown in FIG. 5, memory cells 210, 211, 212, and 213 of respective memory cell strings (e.g., memory cell string 231a) can be located in different levels (e.g., levels 503, 505, 507, and 509) in the Z-direction of memory device 200. The control gates (associated with signals WL0, WL1, WL2, and WL3) of each of blocks BLK0 and BLK1 can be located on the same levels (e.g., levels 503, 505, 507, and 509) at which memory cells 210, 211, 212, and 213 are located. Thus, memory cells 210, 211, 212, and 213 and the control gates of blocks BLK0 and BLK1 can be located (e.g., vertically located) along respective portions (e.g., portions on levels 503, 505, 507, and 509) of pillars 550 in the Z-direction.

Substrate 599 of memory device 200 can include monocrystalline (also referred to as single-crystal) semiconductor material. For example, substrate 599 can include monocrystalline silicon (also referred to as single-crystal silicon). The monocrystalline semiconductor material of substrate 599 can include impurities, such that substrate 599 can have a specific conductivity type (e.g., n-type or p-type).

Although not shown in FIG. 5, memory device 200 can include circuitry located in (e.g., formed in) substrate 599. At least a portion of the circuitry can be located in a portion of substrate 599 that is under (e.g., directly under) memory cell strings of blocks BLK0 and BLK1. The circuitry can include decoder circuits, driver circuits (e.g., word line drivers), buffers, sense amplifiers, charge pumps, and other circuitry of memory device 200.

In FIG. 5, source 290 can include a conductive material (or materials (e.g., different levels of different materials)) and can have a length extending in the X-direction. FIG. 5 shows an example where source 290 can be formed over a portion of substrate 599 (e.g., by depositing a conductive material over substrate 599). Alternatively, source 290 can be formed in or formed on a portion of substrate 599 (e.g., by doping a portion of substrate 599).

The select lines (associated with signals SGS and SGD) of blocks BLK0 and BLK1 can have the same material (or materials) as the control gates (associated with signals WL0, WL1, WL2, and WL3) of blocks BLK0 and BLK1. Alternatively, the select gates associated with signal SGS, SGD, or both have material (or materials) different from the material of the control gates.

Figure 6:
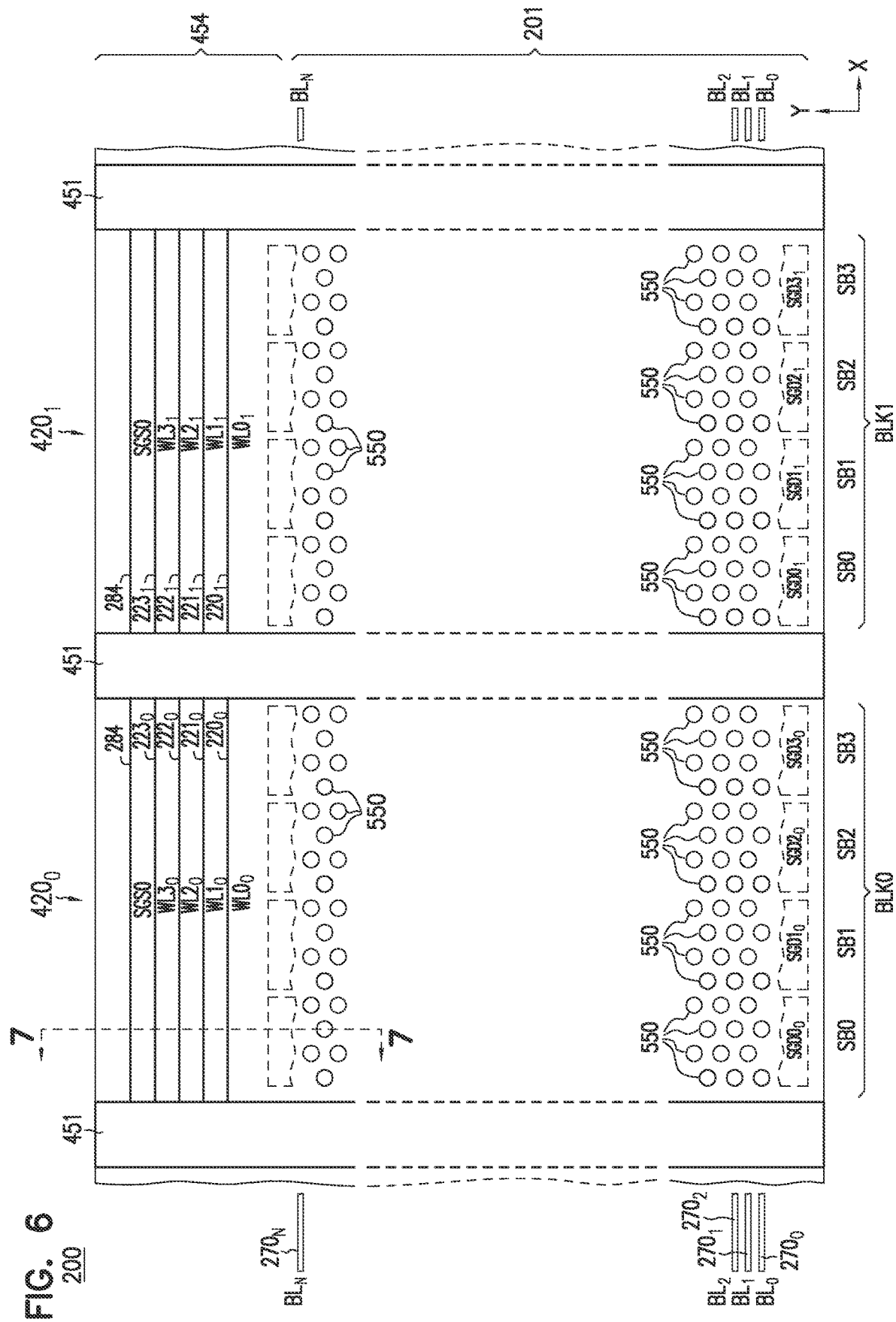
FIG. 6 shows a top view of a structure of a portion of the memory device of FIG. 4 and FIG. 5, including blocks and pillars in the blocks, according to some embodiments described herein.

FIG. 6 shows a top view of a structure of a portion of memory device 200 of FIG. 4 including pillars 550 located in memory array 201 and staircase structures 420$_0$ and 420$_1$ located in staircase region 454, according to some embodiments described herein. In FIG. 6, select lines associated with signals SGD0$_0$, SGD1$_0$, SGD2$_0$, and SDG3$_0$ in block BLK0 and signals SGD0$_1$, SGD1$_1$, SGD2$_1$, and SDG3$_1$ in block BLK1 are partially shown as dotted lines. Each of sub-blocks SB0, SB1, SB2, and SB3 can include multiple rows of pillars 550 associated with a respective select line (one of the select lines associated with signals SGD0$_0$, SGD1$_0$, SGD2$_0$, and SDG3$_0$). As shown in FIG. 6, the multiple rows of pillars 550 can be located one after another in the X-direction (having lengths parallel to the Y-direction). FIG. 6 shows an example where each sub-block includes four rows of pillars 550. However, the number of rows in the sub-blocks can be less than four or greater than four.

In FIG. 6, data lines 270$_0$ through 270$_N$ are partially shown for simplicity. Data lines 270$_0$ through 270$_N$ can extend across (in the X-direction) the blocks (e.g., blocks BL0 and BL1) and located over pillars 550. Connections (e.g., vertical connections in the Z-direction) between pillars 550 and data lines 270$_0$ through 270$_N$ are not shown in FIG. 6. However, each pillar 550 in the same sub-block of a block can be coupled to a separate (e.g., unique) data line among data lines 270$_0$ through 270$_N$.

As shown in FIG. 6, pillars 550 can be located in memory array 201, which is adjacent staircase region 454. A side view (e.g., cross-section) along line 7-7 at staircase structure 420$_0$ of block BLK0 is shown in FIG. 7.

FIG. 7 shows a side view of a portion of memory device 200 including a portion of staircase structure 420$_0$ and a pillar 550, according to some embodiments described herein. Levels 501 through 511 and tiers 525 of memory device 200 in FIG. 7 are the same as those shown in FIG. 5. As shown in FIG. 7, pillar 550 can be located in the portion of memory device 200 that includes memory array 201 (also shown in top view in FIG. 4 and FIG. 6). Pillar 550 can extend through conductive materials 522 (which form the control gates and the select lines) and dielectric materials 521 in the portions that include memory array 201. Staircase structure 420$_0$ of block BLK0 in FIG. 7 can be located in the portion of memory device 200 that includes staircase region 454 (which is also shown in top view in FIG. 4 and FIG. 6).

As shown in FIG. 7, memory device 200 can include a structure 730 and a dielectric material 705 that can be part of pillar 550. Structure 730 and a dielectric material 705 can extend continuously (in the Z-direction) along the length of the respective pillar 550. Dielectric material 705 can include silicon dioxide. Structure 730 can be electrically coupled to source 290 and a respective data line (e.g., one of data line 270$_0$ through 270$_N$, in FIG. 3 and FIG. 6). Structure 730 of a respective pillar 550 in a block is adjacent portions of respective control gates of that block. For example, structure 730 of pillar 550 in block BLK0 is adjacent control gates 220$_0$, 221$_0$, 222$_0$, and 223$_0$ of block BLK0.

Structure 730 can include a conductive structure that can be part of a conductive path (e.g., pillar channel structure) to conduct current between a respective data line (e.g., one of data line 270$_0$ through 270$_N$ in FIG. 3 and FIG. 6) coupled to structure 730 and source 290. Structure 730 can also include a material (or materials) that can form a charge storage element (e.g., a memory element) of a respective memory cell (among memory cells 210, 211, 212, and 213) located along a portion of pillar 550. As an example, structure 730 can be part of an ONOS ($SiO_2$, $Si_3N_4$, $SiO_2$, Si) where $Si_3N_4$ material can form a charge storage element of a respective memory cell, and Si material can be part of the pillar channel structure of pillar 550. In another example, structure 730 include can be part of a SONOS (Si, $SiO_2$, $Si_3N_4$, $SiO_2$, Si) structure, a TANOS (TaN, $Al_2O_3$, $Si_3N_4$, $SiO_2$, Si) structure, a MANOS (metal, $Al_2O_3$, $Si_3N_4$, $SiO_2$, Si) structure, or other structures. Alternatively, structure 730 can include a floating gate structure (e.g., polysilicon structure) where the floating gate structure can form a charge storage element of a respective memory (among memory cells 210, 211, 212, and 213) located along a portion of pillar 550.

As shown in FIG. 7, the control gates associated with signals WL0$_0$, WL1$_0$, WL2$_0$, and WL3$_0$, and the select lines associated with signals (e.g., drain select signal and source select signal) SGD0$_0$ and SGS0 can be structured (e.g., patterned), such that they can have different lengths in the Y-direction and their respective portions (e.g., end portions) can collectively form staircase structure 420$_0$. As shown in FIG. 7, staircase structure 420$_0$ can have regions 721 and regions 722 coupled to regions 721 on respective tiers 525 of memory device 200. Regions 721 can be called tread regions of staircase structure 420$_0$. Regions 722 can be called riser regions of staircase structure 420$_0$.

As shown in FIG. 7, each region (e.g., tread region) 721 can have a surface (e.g., horizontal surface, not labeled) perpendicular to the Z-direction. Each region 721 can extend laterally away from an adjacent region (e.g., riser region) 722 in the Y-direction. Each region 722 can have a sidewall (e.g., vertical sidewall) 722W parallel to the Z-direction. Sidewall 722W of a respective region 722 of a particular tier 525 can be formed from a portion (e.g., vertical edge portion) of material 522 of a respective control gate and a portion (e.g., vertical edge portion) of a dielectric material 521 of that particular tier.

Each of regions 721 and each of regions 722 are part of a respective control gate among the control gates. Regions 721 can be contact landing regions for the control gates where conductive structures for example, conductive pads 755 and conductive contacts 765 (described below), can be formed on regions 721.

Memory device 200 can include conductive pads 755 located on (e.g., directly located on) respective regions 722 of control gates (associated with signals $WL0_0$, $WL1_0$, $WL2_0$, and $WL3_0$) and respective regions of select lines (associated with signals $SGD_0$ and $SGS_0$) at staircase structure $420_0$. Conductive pads 755 and the control gates can have different conductive materials. For example, conductive pads 755 can include doped polysilicon (conductively doped polysilicon), and control gates can include a conductive material (or a combination of conductive materials) different from doped polysilicon material. Examples of conductive materials for the control gate include metal (e.g., tungsten or other conductive materials). Alternatively, conductive pads 755 and the control gates can have the same conductive materials. For example, conductive pads 755 can include conductively doped polysilicon and the control gates can also include conductively doped polysilicon.

Each conductive pad 755 has thickness (e.g., thickness T1, not labeled in FIG. 7) in the Z-direction. Each of the control gates has thickness (e.g., thickness T2, not labeled in FIG. 7) in the Z-direction. The thickness (e.g., thickness T1) of conductive pad 755 can be different from or the same as the thickness (e.g., thickness T2) of the control gates. Thus, the thickness ((e.g., thickness T1) of conductive pad 755 can be less than the thickness (e.g., thickness T2) of the control gates or can be greater than the thickness (e.g., thickness T2) of the control gates.

As shown in FIG. 7, conductive pads 755 can include respective lengths (e.g., lengths L1, not labeled in FIG. 7) in the Y-direction. The lengths (e.g., length L1) of conductive pads 755 can be the same (or substantially the same (e.g., lengths measuring within 10% among each other)).

As shown in FIG. 7, the control gates (associated with signals $WL0_0$, $WL1_0$, $WL2_0$, and $WL3_0$) can include different lengths in the Y-direction measuring between pillar 550 and locations of respective conductive pads 755. The lengths (e.g., length L1) of each conductive pad 755 can be less than the length of a respective control gate.

As shown in FIG. 7, memory device 200 can include openings (e.g., holes) 720 formed in a dielectric material 781 in staircase region 454. Memory device 200 can include dielectric materials (e.g., dielectric liners) 731 formed on sidewalls of respective openings 720. Memory device 200 can include conductive contacts 765 formed in respective openings 720. Each of conductive contacts 765 can have a cylindrical shape. Conductive contacts 765 can have respective lengths extending in the Z-direction and contact (e.g., electrically couple to) respective conductive pads 755. As shown in FIG. 7, conductive pads 755 can be directly located on (e.g., directly formed on) respective regions (e.g., contact landing regions) 721. Conductive contacts 765 can be directly located on (e.g., directly formed on) respective conductive pads 755 and contact respective control gates through respective conductive pads 755. Thus, conductive contacts 765 indirectly contact respective control gates.

Conductive contacts 765 and conductive pads 755 can have the same conductive materials or different conductive materials. For example, conductive pads 755 can include doped polysilicon and conductive contacts 765 can include metal (e.g., tungsten or other conductive materials). Electrical signals (e.g., signal signals $WL0_0$, $WL1_0$, $WL2_0$, and $WL3_0$) can be provided to the control gates through respective conductive contacts 765 and respective conductive pads 755.

The above description with reference to FIG. 2 through FIG. 7 describes the structure of memory device 200. Some or all of the structure of memory device 200 can be formed using processes associated with the processes described below with reference to FIG. 8 through FIG. 41.

Figure 8:
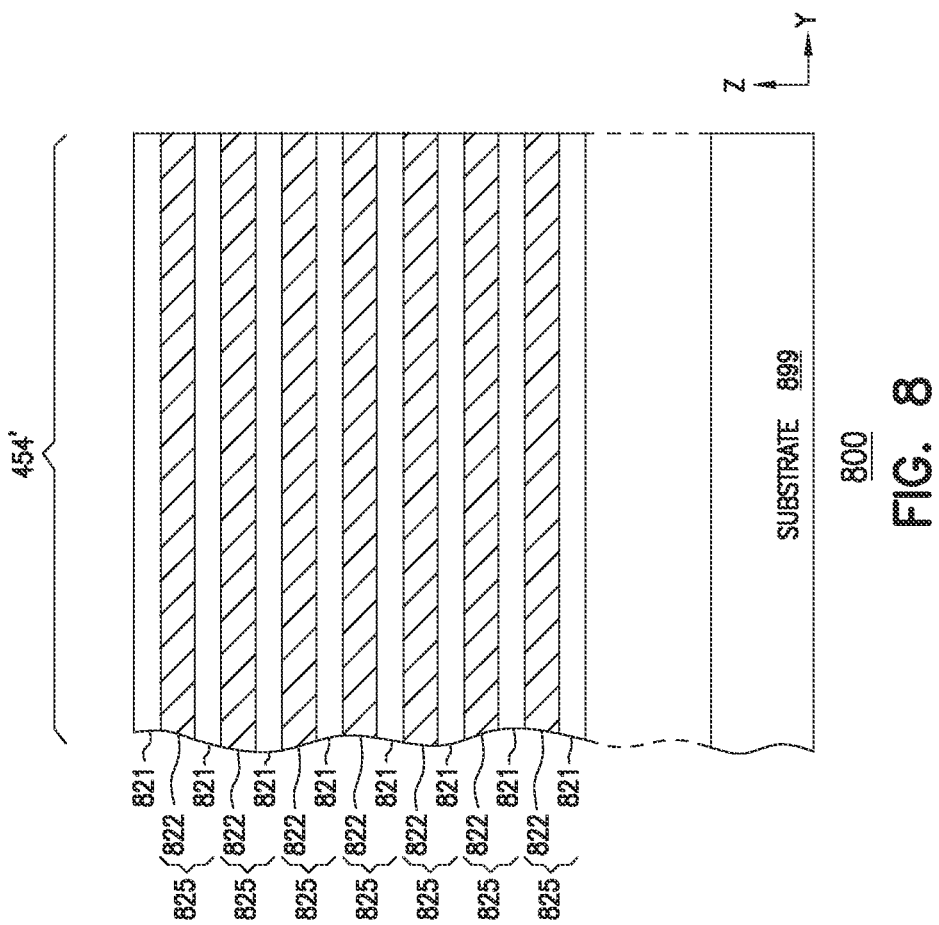
FIG. 8 through FIG. 16 show processes of forming a memory device including forming conductive pads at a staircase structure of the memory device, according to some embodiments described herein.

FIG. 8 through FIG. 16 show processes of forming memory device 800 including forming conductive pads (FIG. 14) at a staircase structure of memory device 800, according to some embodiments described herein. FIG. 8 shows a side view (e.g., cross-section) in the Y-direction of a portion of memory device 800 that includes a staircase region 454'. Staircase region 454' is similar to (e.g., can correspond to) staircase region 454 of memory device 200 of FIG. 7.

The processes associated with FIG. 8 include forming dielectric materials (levels of dielectric materials) 821 and dielectric materials (levels of dielectric materials) 822 over a substrate 899. Dielectric materials 821 can include silicon dioxide. Dielectric materials 822 can include silicon nitride. Substrate 899 is similar to (e.g., can correspond to) substrate 599 (FIG. 5) of memory device 200. Dielectric materials 821 and 822 can be sequentially formed one material after another over substrate 899 in an interleaved fashion, such that dielectric materials 821 can be interleaved with dielectric materials 822. As shown in FIG. 8, dielectric materials 821 and 822 can form tiers (tiers of materials) 825. Tiers 825 are located one over another. Each tier 825 can include a respective level of dielectric material 821 and a respective level of dielectric material 852.

For simplicity and not to obscure the example embodiments described herein, a portion in dashed lines under dielectric materials 821 and 822 is omitted from FIG. 8. One skilled in the art would readily recognize that the process of forming memory device 800 described herein can include forming additional elements (not shown) in the dashed-line portion. In the description herein, elements given the same numerical labels are similar or the same elements.

Figure 9:
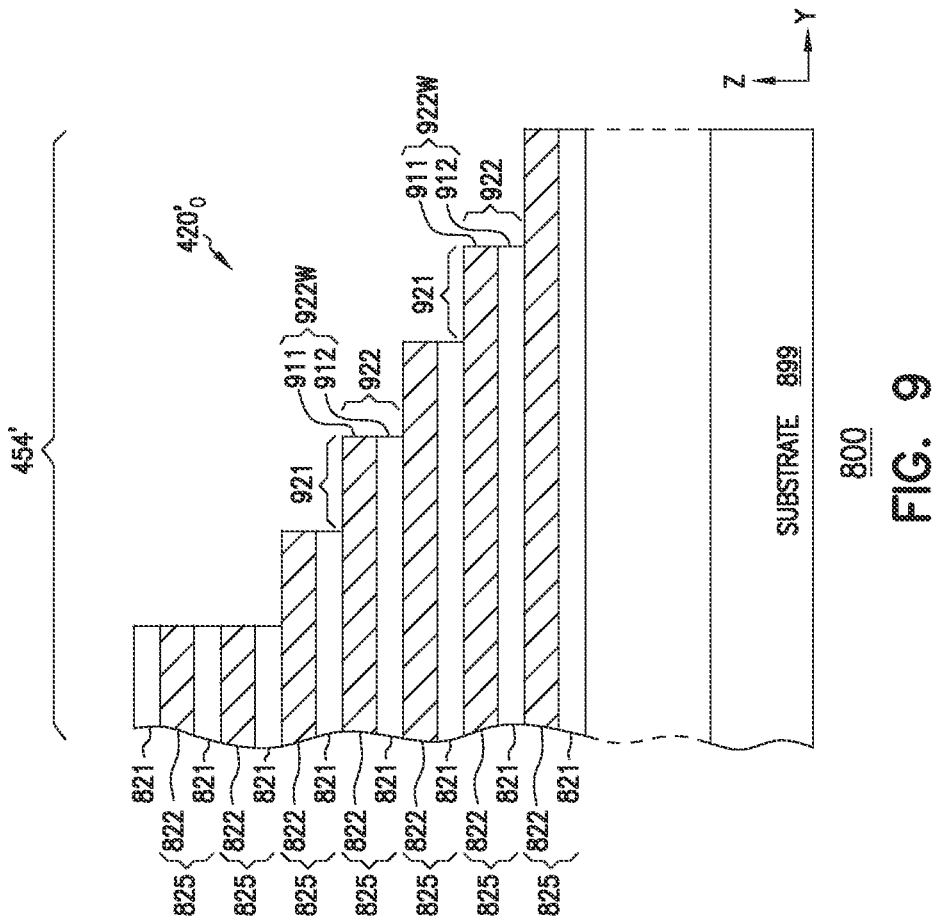

FIG. 9 shows memory device 800 after a staircase structure $420'_0$ is formed. Staircase structure $420'_0$ is similar to (e.g., can correspond to) staircase structure 420 of memory device 200 of FIG. 7. Forming staircase structure $420'_0$ can include removing a portion of dielectric materials 821 and 822 to obtain a remaining portion (shown in FIG. 9) of dielectric materials 821 and 820. As shown in FIG. 9, the remaining portion of dielectric materials 821 and 822 can collectively form staircase structure $420'_0$.

Staircase structure $420'_0$ can include regions 921 and 922. Regions 921 can be called tread regions of staircase structure $420'_0$. Regions 922 can be called riser regions of staircase structure $420'_0$. As shown in FIG. 9, each region (e.g., tread region) 921 can have a surface (e.g., horizontal surface, not labeled) perpendicular to the Z-direction. Each region 921 can extend laterally and away from an adjacent region (e.g., riser region) 922 in the Y-direction. Each region 922 can have a sidewall (e.g., vertical sidewall) 922W parallel to the Z-direction. As shown in FIG. 9, sidewall 922W of a respective region 922 of a particular tier 825 can be formed from a portion (e.g., vertical edge 911) of dielectric material 821 and a portion (e.g., vertical edge 912) of dielectric material 822 of that particular tier.

Figure 10:
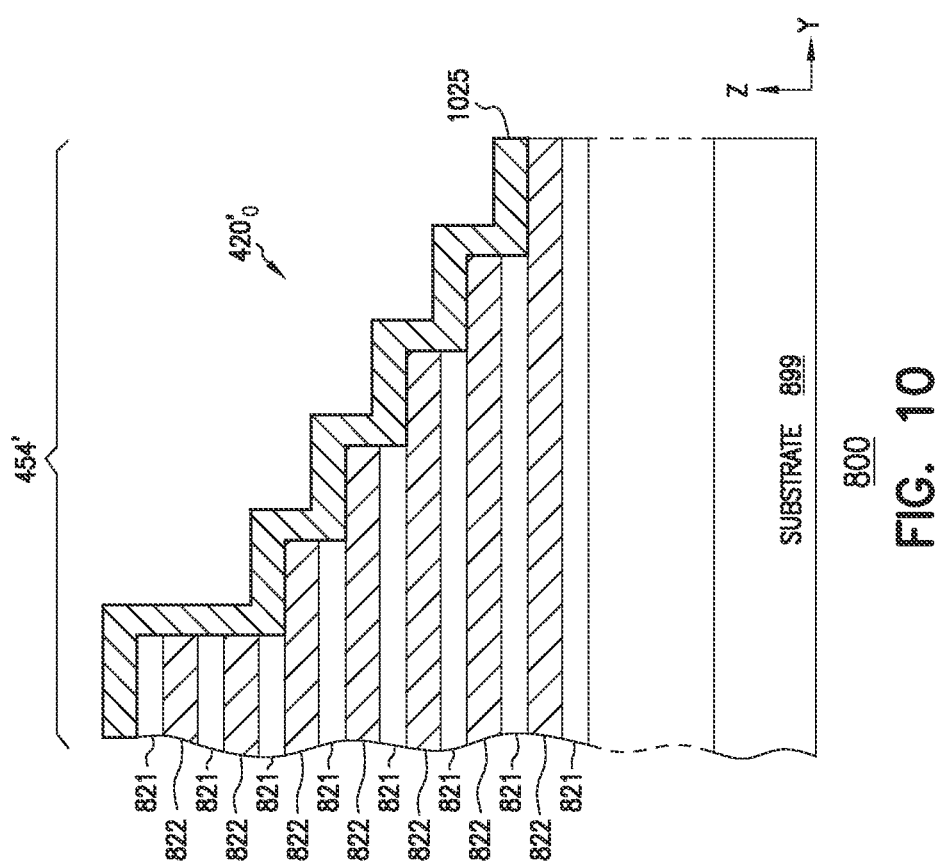

FIG. 10 shows memory device 800 after a polysilicon material 1025 is formed over staircase structure $420'_0$. Polysilicon material 1025 can include undoped polysilicon material. Forming polysilicon material 1025 can include depositing polysilicon material 1025 on regions 921 and regions 922 (labeled in FIG. 9) of staircase structure 420'$_0$, such that polysilicon material 1025 can include a continuous structure from regions 921 to regions 922. As shown in FIG. 10, polysilicon material 1025 can be formed on regions 922, such that polysilicon material 1025 can cover at least a portion of sidewall 922W (e.g., partially cover or entirely cover sidewall 922W) of respective region 922. As described below, polysilicon material 1025 on sidewalls 922W will be removed in subsequent processes to form conductive pads 755' (described below with reference to FIG. 14).

Figure 11:
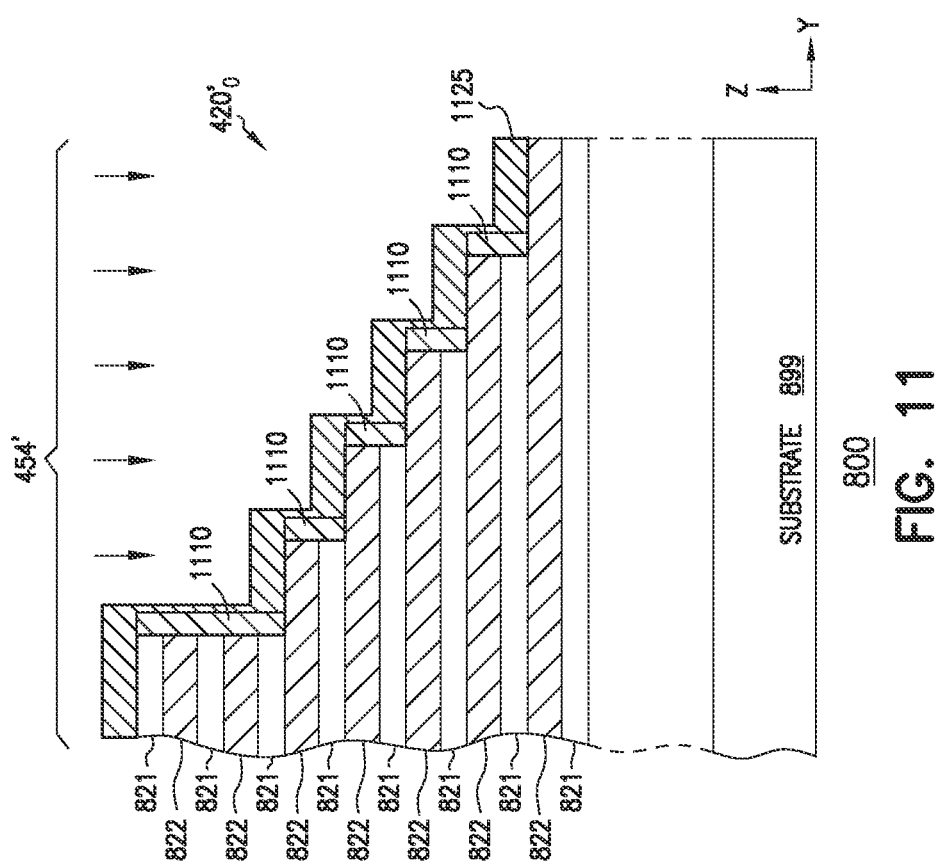

FIG. 11 shows memory device 800 after a doped polysilicon material 1125 is formed. Forming doped polysilicon material 1125 can include performing a doping process to dope polysilicon material 1025 (FIG. 10) with dopants to form doped polysilicon material 1125 from the combination of polysilicon material 1025 and the dopants. The doping process can also form materials 1110 on respective regions 922. The dopants in doped polysilicon material 1125 can include p-type dopants or n-type dopants. Examples of the dopants used in the doping process associated with FIG. 11 include boron, oxygen, carbon, and nitrogen or other dopant materials.

The doping process can be performed to mainly dope polysilicon material 1025 (FIG. 10) on regions (e.g., tread regions) 921 because conductive pads 755' (described below with reference to FIG. 13) will be mainly formed from doped polysilicon material 1125 on regions 921. Thus, polysilicon material 1025 on regions (e.g., riser regions) 922 may be left undoped. However, some of the dopants in the doping process may penetrate polysilicon material 1025 (FIG. 10) on regions 922. Thus, during the doping process, a relatively small portion of polysilicon material 1025 in regions 922 may be doped with a relatively small amount of dopant. Therefore, after the doping process in FIG. 11, materials 1110 on respective regions 922 may include a portion (e.g., surface portion) of doped polysilicon material that covers a portion (portion on sidewalls 922W) of undoped polysilicon material. The portion of doped polysilicon material of material 1110 can be a relatively small part of doped polysilicon material 1125. The undoped polysilicon material of material 1110 can be part of polysilicon material 1025 (FIG. 10) on respective regions 922 that was not doped during the doping process in FIG. 11.

In some doping processes, dopants may not penetrate polysilicon material 1025 (FIG. 10) on regions (e.g., riser regions) 922. Thus, in some processes, material 1110 in FIG. 11 may include undoped polysilicon material and may not include doped polysilicon material. The undoped polysilicon material is polysilicon material 1025 formed on regions 922 that may remain undoped (that was not doped) after the doping process of FIG. 11.

Thus, as described above, after the doping process that form doped polysilicon material 1125 in FIG. 11, material 1110 can include at least one of undoped polysilicon material (a portion of polysilicon material 1025 in FIG. 10 formed before the doping process in FIG. 11) and a portion of doped polysilicon (a portion of doped polysilicon material 1125 formed during the doping process associated with FIG. 11).

The doping process associated with FIG. 11 can include an ion implantation process followed by an annealing process. The implantation process can include implanting dopants into polysilicon material 1025 (FIG. 10). The arrows pointing downward in FIG. 11 present the implantation process and the dopants used in the implantation process. The dopants used in the implantation process can include at least one of boron, oxygen, carbon, and nitrogen. However, other n-type or p-type dopants can be used. The annealing process (performed after the ion implantation process) can be performed to activate the dopants that were implanted in polysilicon material 1025 in the implantation process. The annealing process can include a rapid thermal annealing process.

Figure 12:
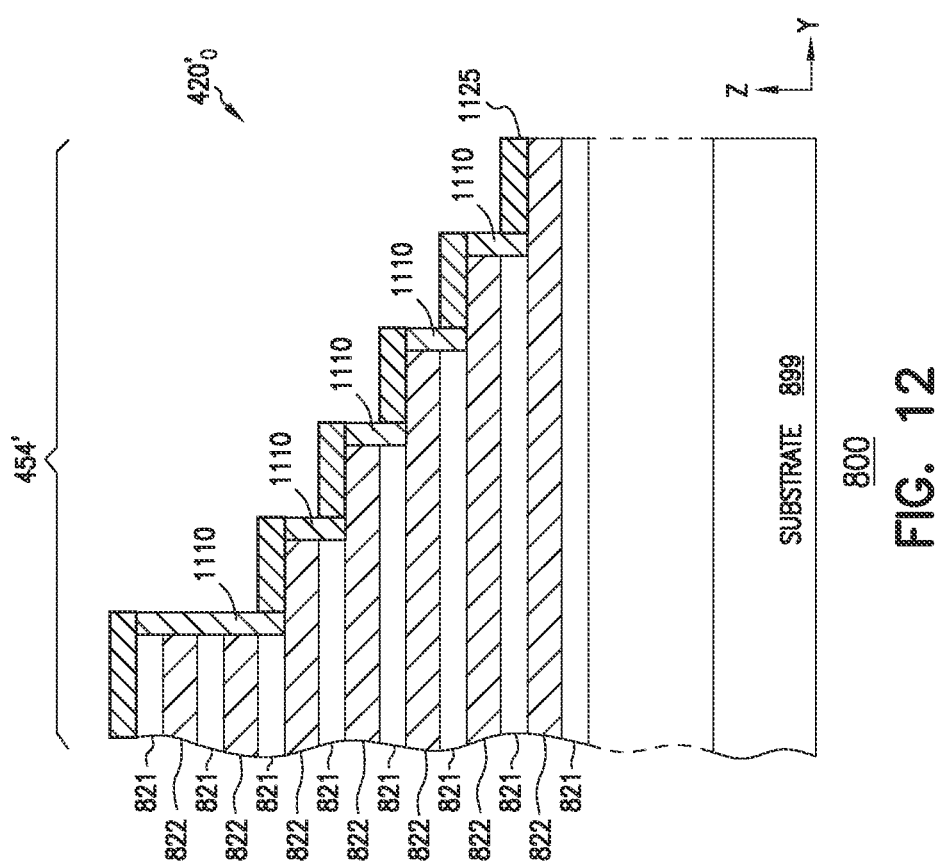

FIG. 12 shows memory device 800 after part of doped polysilicon material 1125 is removed (e.g., using a decapping process). The removed part of doped polysilicon material 1125 includes an outer part (e.g., part near the surface) of portion of doped polysilicon material 1125. As shown in FIG. 12, after part (e.g., outer part) of doped polysilicon material 1125 in FIG. 11 was removed, the remaining part (remaining portion) in FIG. 12 of doped polysilicon material 1125 can be thinner than doped polysilicon material 1125 in FIG. 11. The outer part of doped polysilicon material 1125 (that was removed) can include a portion (e.g., vertical portion) of material 1110. As shown in FIG. 12, the remaining portion of material 1110 (e.g., after a decapping process) can be exposed (not covered by doped polysilicon material 1125). The remaining portion of material 110 may include (e.g., include only) undoped polysilicon material, which are portions of polysilicon material 1025 (formed in FIG. 10) that was not doped during the doping process.

Figure 13:
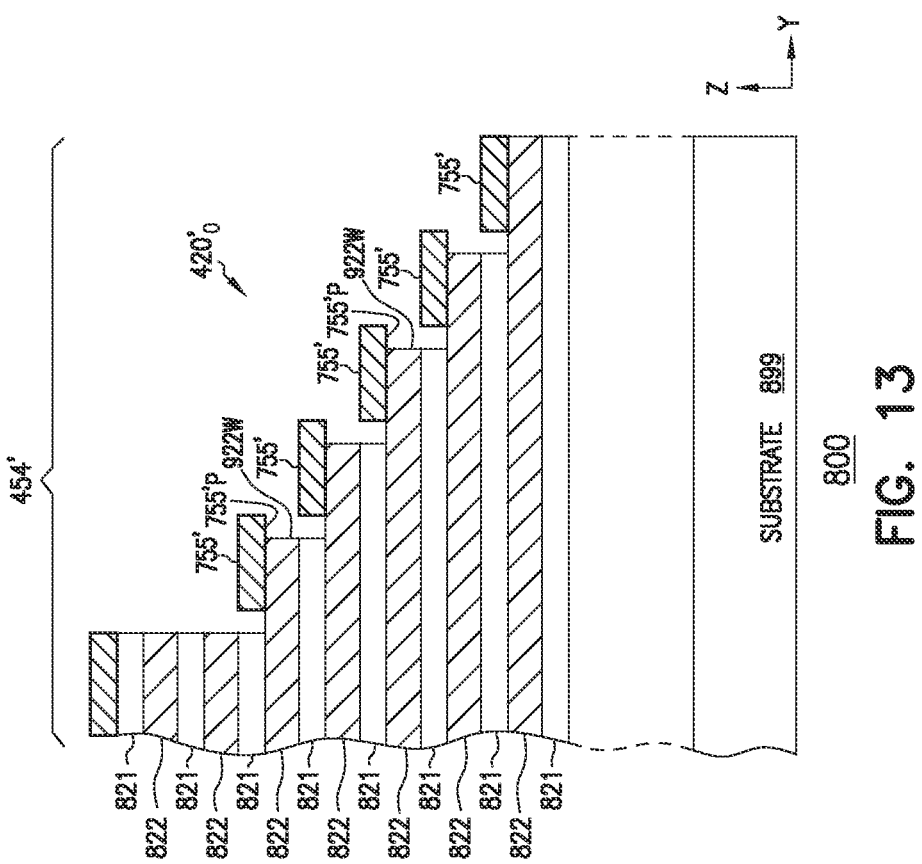

FIG. 13 shows memory device 800 after conductive pads 755' are formed. Conductive pads 755' are similar to (e.g., can correspond to) conductive pads 755 of memory device 200 of FIG. 7. In FIG. 13, forming conductive pads 755' can include removing materials 1110 (FIG. 12) from respective regions 922 (e.g., from sidewalls 922W of regions 922). Removing materials 1110 can be performed until sidewalls 922W (which were covered by materials 1110) are exposed, such that portions of doped polysilicon material 1125 formed on regions (e.g., tread regions) 921 can be separated (electrically separated) from each other. The separated portions of doped polysilicon material 1125 form conductive pads 755'. As shown in FIG. 13, each conductive pad 755' can include a portion 755'P, which is part of the doped polysilicon material 1125 that forms conductive pad 755'. Portion 755'P can extend in the Y-direction past sidewall 922W" of a respective region 922, such that portion 755'P can overhang a sidewall 922W of a respective region 922, as shown in FIG. 13.

An etch process can be used to selectively remove materials 1110 from respective regions 921 (e.g., from sidewalls 922W) and leaving (to removing) portions of doped polysilicon material 1125 on regions 922. The etch process can include performing an anisotropic etch to selectively remove (e.g., vertically etch) materials 1110 from respective regions 921. The anisotropic etch can include using tetramethyl ammonium hydroxide (TMAH).

Figure 14:
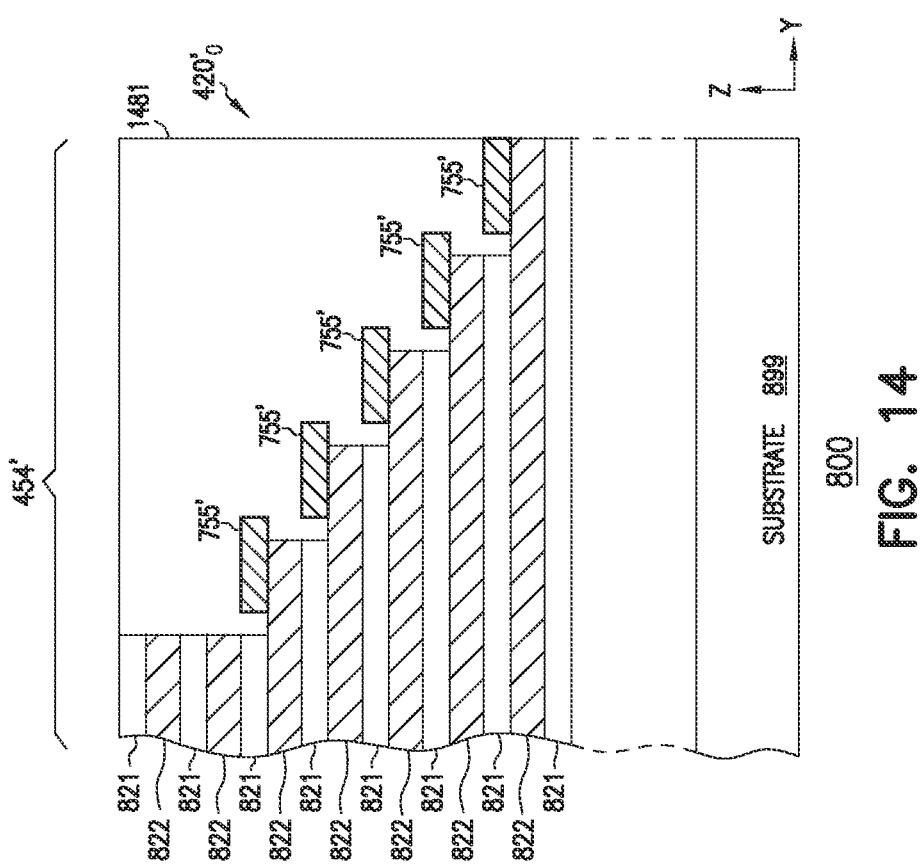

FIG. 14 shows memory device 800 after a dielectric material 1481 is formed. Forming dielectric material 1481 can include depositing a dielectric material (e.g., silicon dioxide) over conductive pads 755' and over other elements of memory device 800 at staircase structure 420$_0$.

Figure 15:
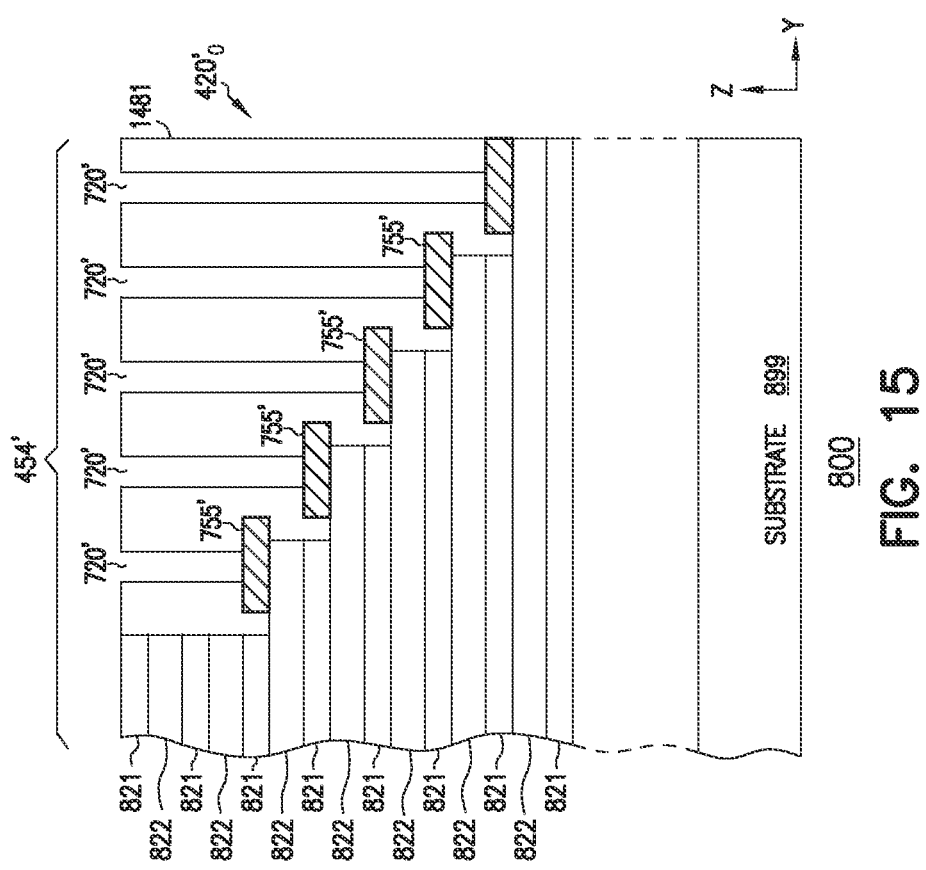

FIG. 15 shows memory device 800 after openings (e.g., holes) 720' are formed in dielectric material 1481. Openings 720' can be formed to expose conductive pads 755' through openings 720'. Forming openings 720' can include removing (e.g., etching) a portion of dielectric material 1481 at the locations of openings 720'. Openings 720' are similar to (e.g., can correspond to) openings 720 of memory device 200 of FIG. 7.

Figure 16:
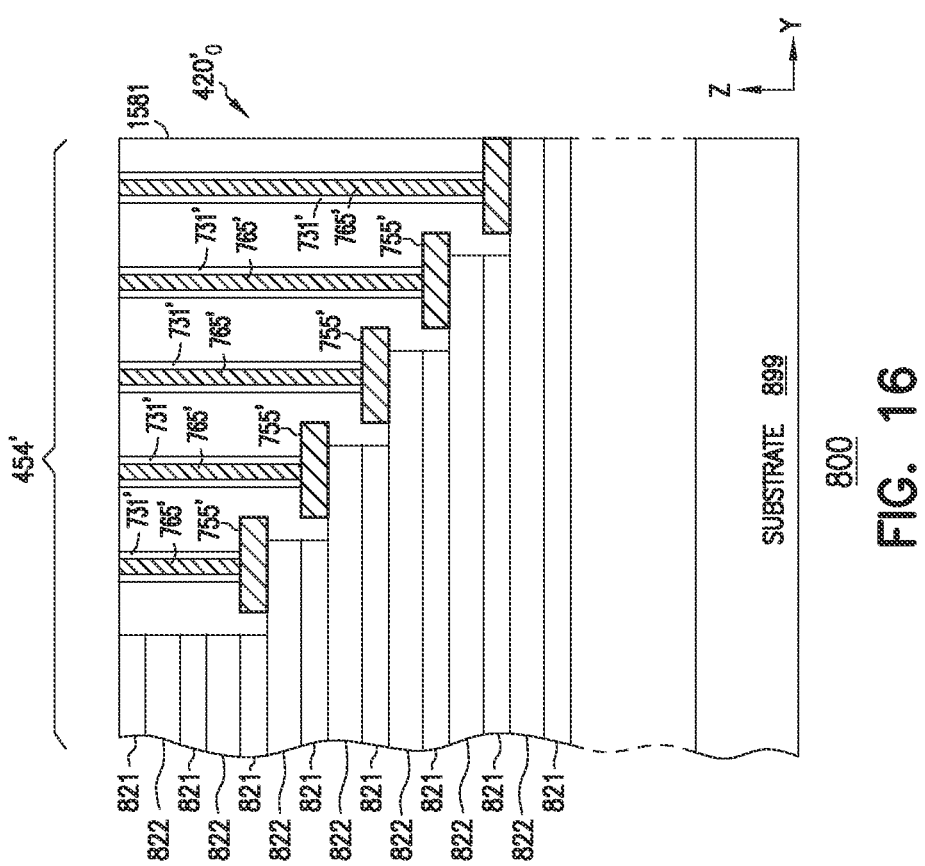

FIG. 16 shows memory device 800 after dielectric materials (e.g., dielectric liners) 731' and conductive contacts 765' are formed. Dielectric materials 731' can be formed on sidewalls of respective openings 720'. Conductive contacts 765' can be formed after dielectric materials 731' are formed. Dielectric materials 731' and conductive contacts 765' are similar to (e.g., can correspond to) dielectric materials 731 and conductive contacts 765, respectively, of memory device 200 of FIG. 7.

In the processes described above with reference to FIG. 8 through FIG. 16, dielectric materials (e.g., silicon dioxide) 821 and dielectric materials (silicon nitride) 822 are used in the tiers (e.g., tier 825) of memory device 800. However, different materials can be used. For example, instead of using dielectric materials (silicon nitride) 822 in memory device 800 in FIG. 8, a conductive material can be used. As an example, in memory device 800, conductively doped polysilicon can be used instead of dielectric materials 822. In this example, in FIG. 8, levels of conductively doped polysilicon (instead of dielectric materials (silicon nitride) 822 silicon nitride) can be formed to interleave with the levels of dielectric materials (e.g., silicon dioxide) 821.

The processes of forming memory device 800 described above with reference to FIG. 8 through FIG. 16 can include other processes to form a complete memory device (e.g., memory device 200). Such processes can be performed before, after, or during the processes of forming dielectric materials 731' and conductive contacts 765'. Such processes are omitted from the above description so as not to obscure the subject matter described herein.

FIG. 17 through FIG. 23 show processes of forming memory device 1700 including forming pillars (FIG. 17), conductive pads (FIG. 19) at a staircase structure, and control gates (FIG. 21) of memory device 1700, according to some embodiments described herein. Some of the processes of forming memory device 1700 are similar to or the same as those described above for forming memory device 800 (FIG. 8 through FIG. 16). Memory device 1700 can also include elements (e.g., structures) that are similar to or the same as those of memory device 800. For simplicity, detailed description of such processes and elements are not repeated.

Figure 17:
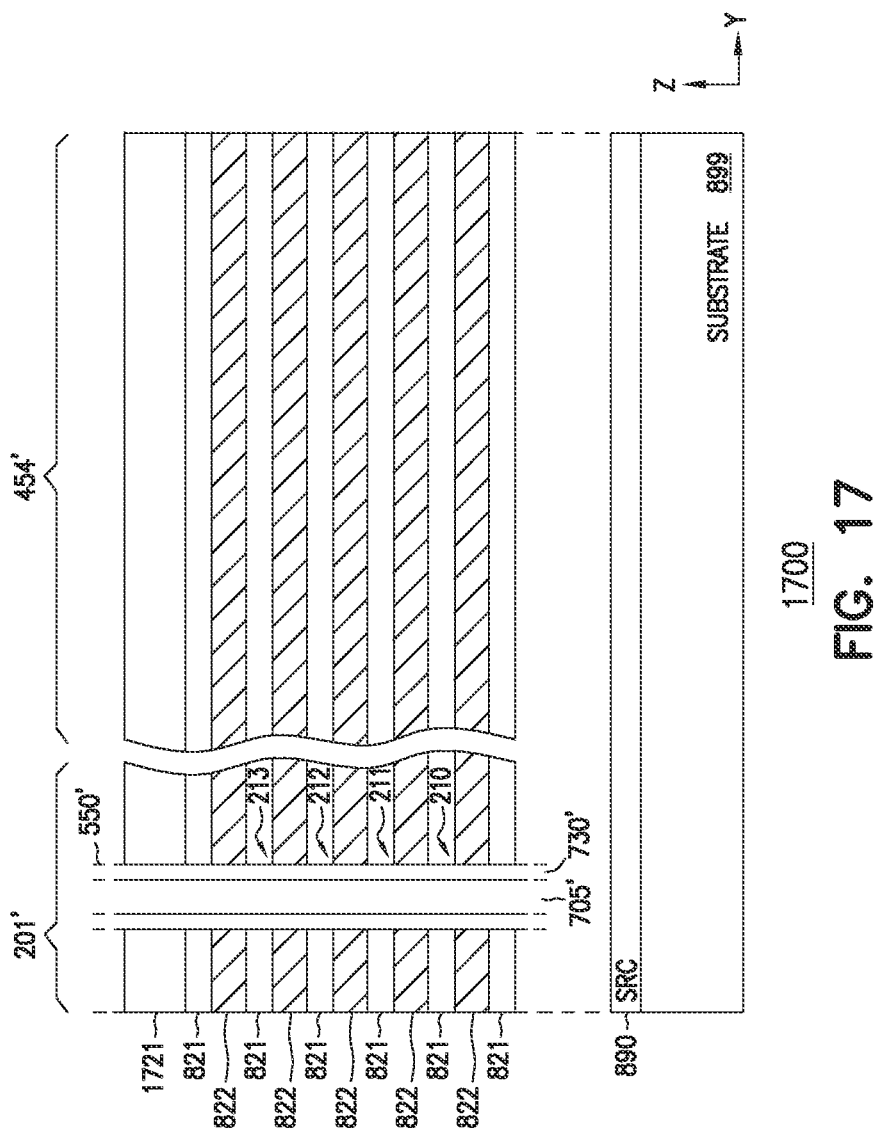
FIG. 17 through FIG. 23 show processes of forming a memory device including forming pillars, conductive pads at a staircase structure, and control gates of the memory device, according to some embodiments described herein.

One skilled in the art would readily recognize that the processes of forming memory device 1700 described herein with reference to FIG. 17 through FIG. 23 can include forming additional elements (not shown) in the portion shown in dashed lines of memory device 1700 in FIG. 17. For example, such additional elements can include select circuits similar to select circuits (e.g., source select circuits) 241'a, 244'a, 241'b, and 244'b and other elements of memory device 200 (e.g., FIG. 2, FIG. 3, and FIG. 5. FIG. 7). For simplicity and not to obscure the embodiments described herein, a description of the formation of such additional elements is omitted from the description herein.

FIG. 17 shows a side view (e.g., cross-section) in the Y-direction of a portion of memory device 1700 that includes a memory array 201', a staircase region 454', a source 890, and substrate 899. Memory array 201' and staircase region 454' are similar to (e.g., can correspond to) memory array 201' and staircase region 454', respectively, of memory device 200 (e.g., FIG. 4). Source 890 is similar to (e.g., can correspond to) source 290 of memory device 200 (e.g., FIG. 7).

The processes associated with FIG. 17 include forming pillars and memory cells of memory device 1700 in memory array 201'. For simplicity, only one pillar 550' and memory cells 210, 211, 212, and 213 of a memory cell string are shown in FIG. 17.

As shown in FIG. 17, pillar 550' can be formed through a dielectric material 1721 and the levels of dielectric materials 821 and 822 (which form tiers of memory device 1700). For simplicity, FIG. 17 omits other elements (e.g., source select lines and select gates) of memory device 1700 that are located between source 890 and dielectric materials 821 and 822.

Forming pillars 550' can include forming a structure 730' and a dielectric material 705'. Pillar 550' is similar to (e.g., can correspond to) pillar 550 of FIG. 7. Structure 730' and dielectric material 705' are similar to (e.g., can correspond to) structure 730 and dielectric material 705, respectively, of FIG. 7. Structure 730' in FIG. 17 can form part of memory cells 210, 211, 212, and 213 of a respective memory cell string of memory device 1700. Memory cells 210, 211, 212, and 213 of memory device 1700 are similar to (e.g., can correspond to) memory cells 210, 211, 212, and 213, respectively, of memory device 200 of FIG. 7.

Figure 18:
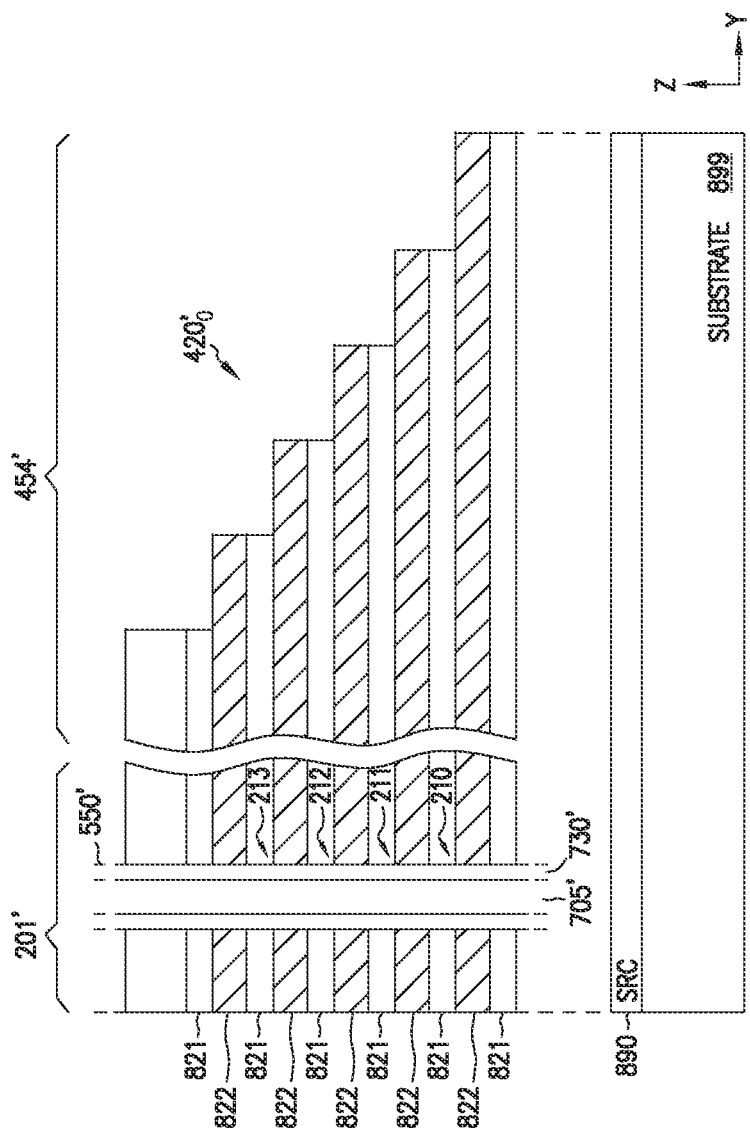

FIG. 18 shows memory device 1700 after staircase structure $420'_0$ is formed. The processes of forming staircase structure $420'_0$ of memory device 1700 are similar to or the same as the processes of forming staircase structure $420'_0$ of memory device 800 of FIG. 9.

Figure 19:
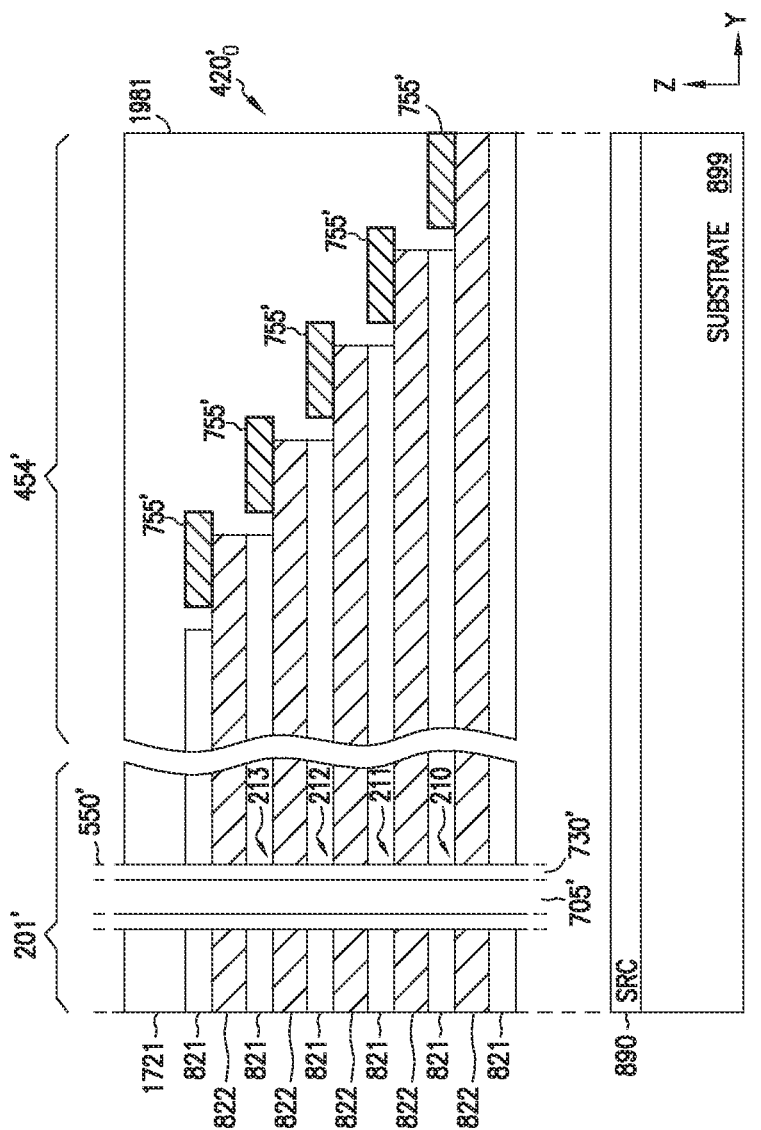

FIG. 19 shows memory device 800 after conductive pads 755' and a dielectric material 1981 are formed. The processes of forming conductive pads 755' and dielectric material 1981 of memory device 1700 are similar to or the same as the processes of forming conductive pads 755' and dielectric material 1481, respectively, of memory device 800 of FIG. 10 through FIG. 14.

Figure 20:
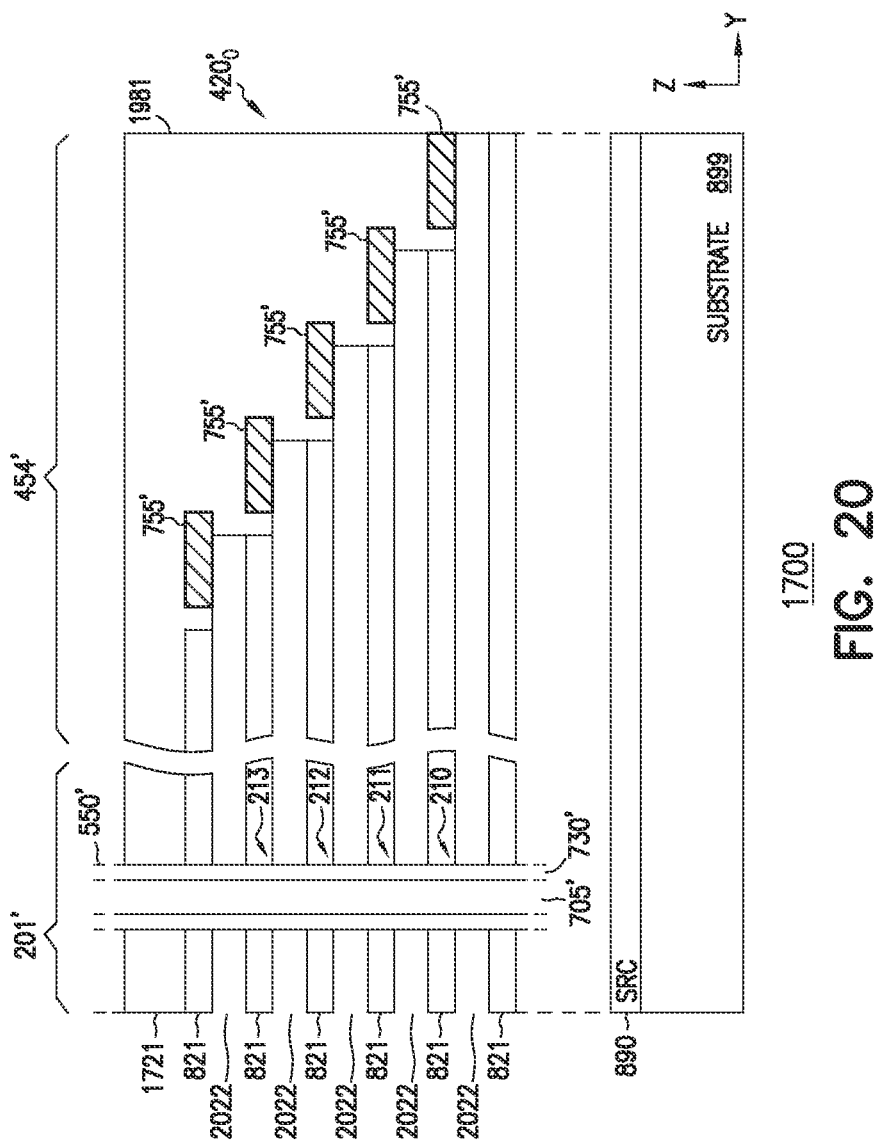
Figure 21:
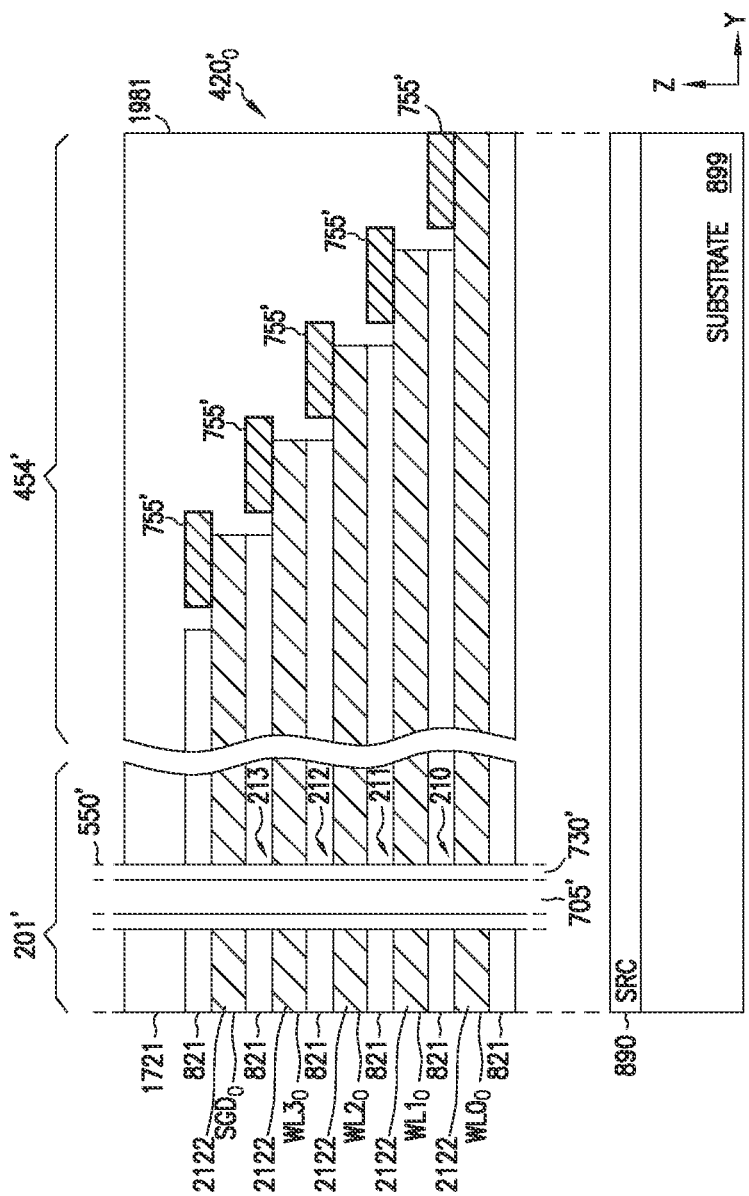

The following descriptions associated with FIG. 20 and FIG. 21 involve processes that include removing and then replacing the levels of dielectric materials (e.g., silicon nitride) 822 with respective levels of conductive materials. The levels of conductive materials form respective control gates in respective tiers in memory device 1700.

FIG. 20 shows memory device 1700 after dielectric materials 822 (FIG. 19) are removed (e.g., exhumed) from locations 2022. Locations 2022 in FIG. 20 are voids (empty spaces) that were occupied by dielectric materials 822. In subsequent processes, conductive materials can be formed in locations 2022 to form respective control gates of memory device 1700.

Figure 22:
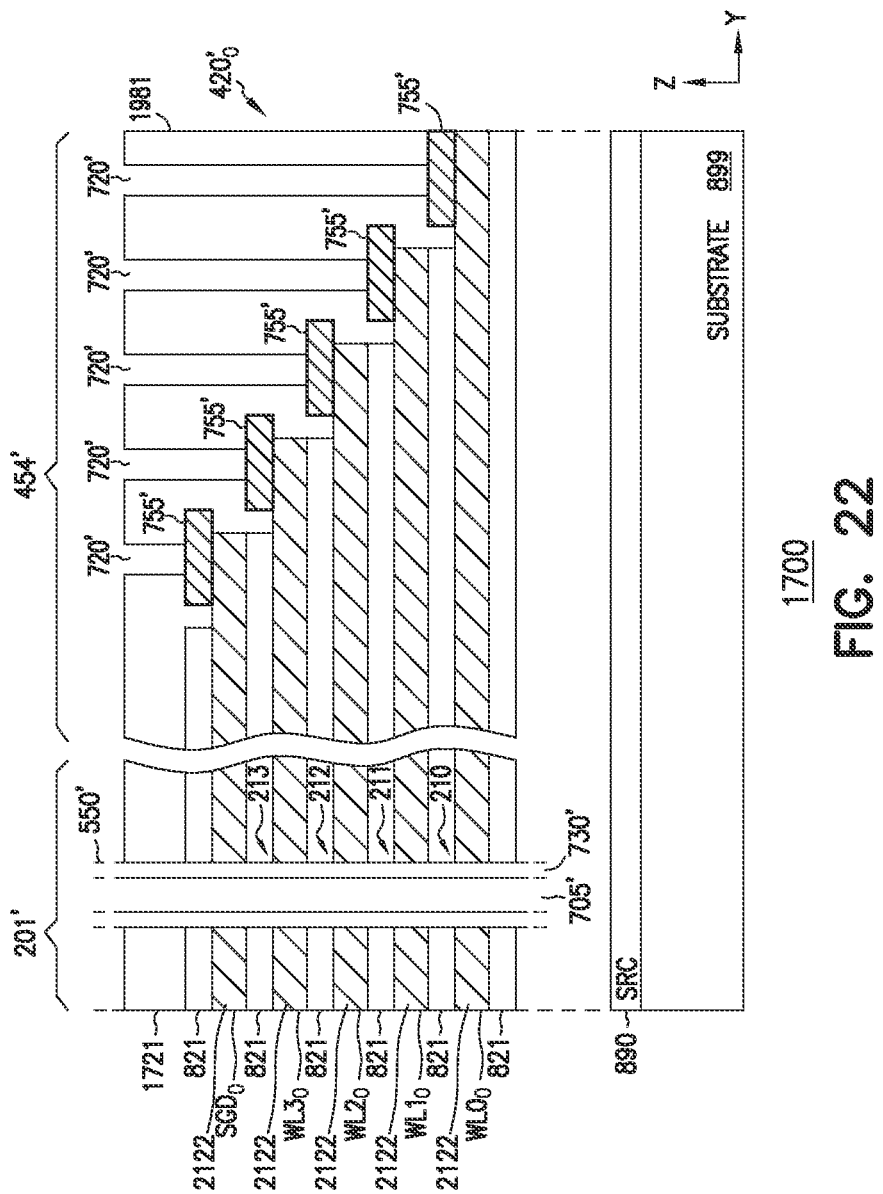

FIG. 21 shows memory device 1700 after formation of control gates associated with signals $WL0_0$, $WL1_0$, $WL2_0$, and $WL3_0$, and a select line (e.g., drain select line) associated with signal (e.g., drain select signal) $SGD0_0$. Forming the control gates and the select line can include forming (e.g., filling) a conductive material (or a combination of conductive materials) 2122 in locations 2022 (FIG. 20). As described above, locations 2022 are locations of dielectric materials 822 (FIG. 19) that were removed in FIG. 20. Thus, in FIG. 22, forming the control gates (associated with signals $WL0_0$, $WL1_0$, $WL2_0$, and $WL3_0$) and the select line (e.g., associated with signal $SGD0_0$) can include replacing the levels of dielectric materials 822 (FIG. 19) with respective levels of conductive materials 2122 (FIG. 22). Conductive materials 2122 can include similar or the same material as conductive materials 522 (FIG. 7) of memory device 200. Thus, conductive materials 2122 can include a single conductive material (e.g., single metal (e.g., tungsten)) or a combination of different layers of conductive materials. For example, conductive material 2122 can include (e.g., multilayers of) aluminum oxide, titanium nitride, and tungsten, or other conductive materials.

FIG. 22 shows memory device 1700 after openings (e.g., holes) 720' are formed in dielectric material 1981. Forming openings 720' can include removing (e.g., etching) a portion of dielectric material 1981 at the locations of openings 720' to expose conductive pads through respective openings.

Figure 23:
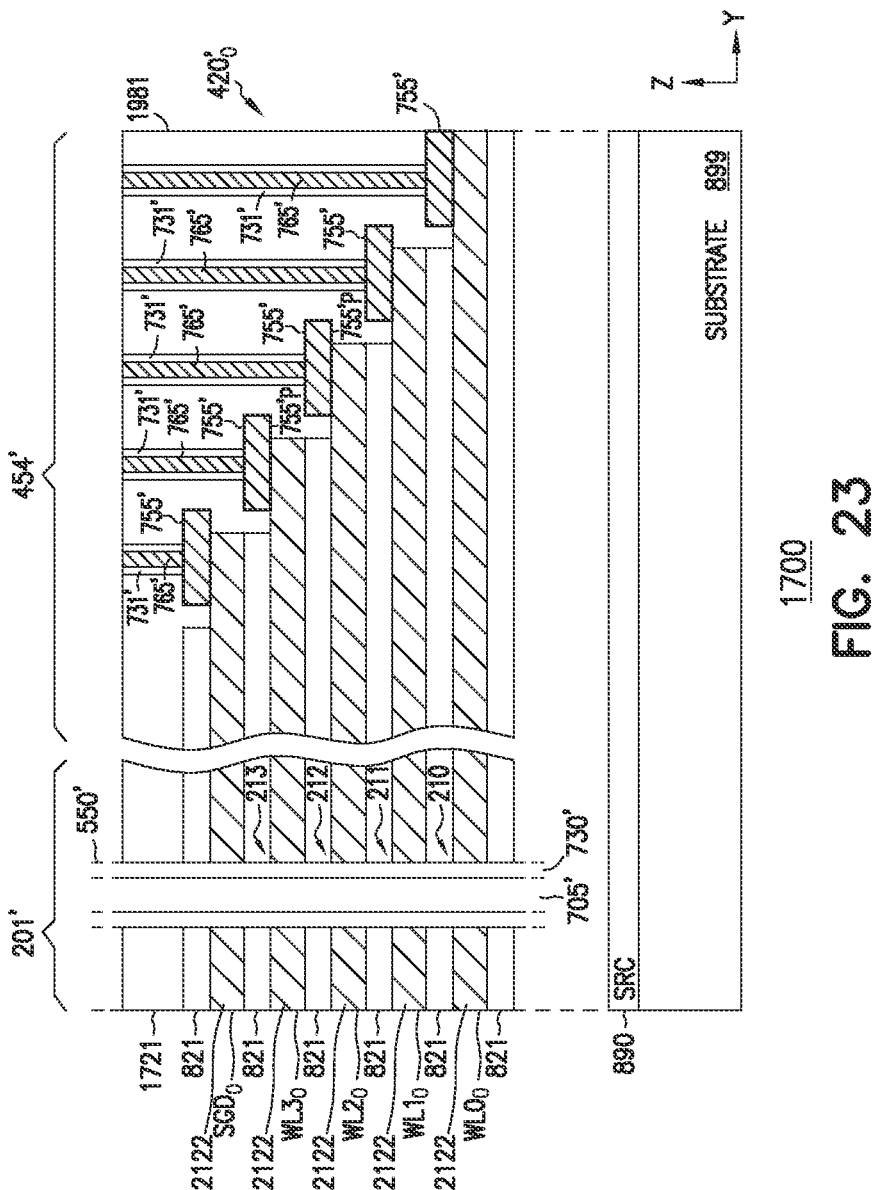

FIG. 23 shows memory device 1700 after dielectric materials (e.g., dielectric liners) 731' and conductive contacts 765' have formed openings 720'. Conductive contacts 765' can be formed to contact (e.g., to be electrically coupled to) respective conductive pads 755'.

As shown in FIG. 23 conductive pads 755' can be directly located on (e.g., directly formed on) respective regions (e.g., contact landing regions) of the control gates. Conductive contacts 765' can be directly located on (e.g., directly formed on) respective conductive pads 755' and contact respective control gates through respective conductive pads 755'. Thus, conductive contacts 765' indirectly contact respective control gates. Electrical signals (e.g., signals $WL0_0$, $WL1_0$, $WL2_0$, and $WL3_0$) from conductive paths (not shown) of memory device 1700 can be provided to the control gates through respective conductive contacts 765' and respective conductive pads 755'.

The processes of forming memory device 1700 described above with reference to FIG. 17 through FIG. 23 can include other processes to form a complete memory device (e.g., memory device 200). Such processes are omitted from the above description so as not to obscure the subject matter described herein.

The structure of memory device 1700 can provide improvements and benefits over some conventional memory devices. For example, the overhang portion (portion 755'P) of conductive pad 755 can increase the dimension (e.g., dimension in the Y-direction) of the contact landing region (which is similar to region 722 of FIG. 7) of a respective control gate of memory device 1700 of FIG. 23. Such an increase in the dimension of the contact landing region can reduce or prevent potential misalignment (e.g., misalignment in the Y-direction) of conductive contacts 765' formed over the contact landing region. In another example, the thickness of conductive pad 755 can be tunable (e.g., can be controlled during the process of forming conductive pad 755 in FIG. 8 through FIG. 16) to accommodate different processes (e.g., etch processes used to form conductive contact 765). Such a tunable thickness of conductive pad 755 can improve the structure (e.g., increase the thickness of in the Z-direction) of the contacting landing region of the control line. This can reduce or prevent punch-through associated with formation of conductive contact 765' formed over the contacting landing region. The improvements and benefits described in the examples herein can lead to at least one of improvement in device structure, reduction in the number of defective devices, higher yield, and lower cost.

FIG. 24 through FIG. 34 show processes of forming memory device 2400 including forming dielectric spacers (FIG. 27) and conductive pads (FIG. 31) at a staircase structure of memory device 2400, according to some embodiments described herein. Some of the processes of forming memory device 2400 are similar to or the same as those described above for forming memory device 800 (FIG. 8 through FIG. 16). Memory device 2400 can also include elements (e.g., structures) that are similar to or the same as those of memory device 800. For simplicity, detailed description of such processes and elements are not repeated.

Figure 24:
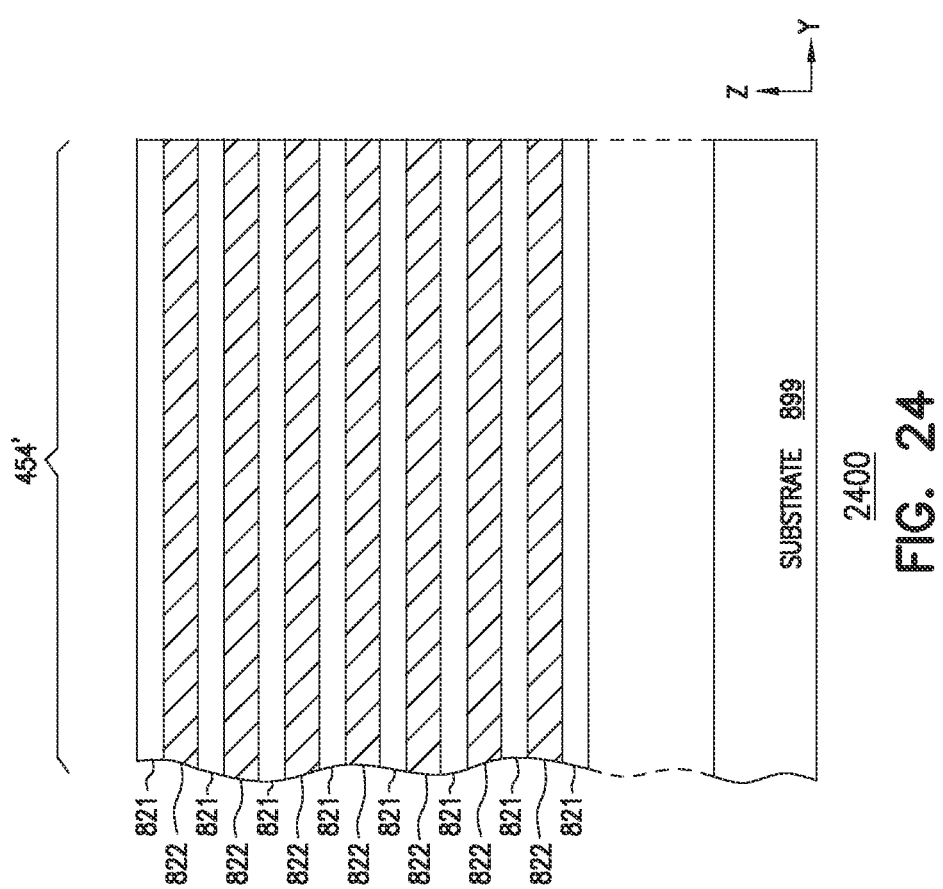
FIG. 24 through FIG. 34 show processes of forming a memory device including forming dielectric spacers and conductive pads at a staircase structure of the memory device, according to some embodiments described herein.

FIG. 24 shows staircase region 454' of memory device 2400 of memory device 2400 after dielectric materials (levels of dielectric materials) 821 and dielectric materials (levels of dielectric materials) 822 are formed over substrate 899.

Figure 25:
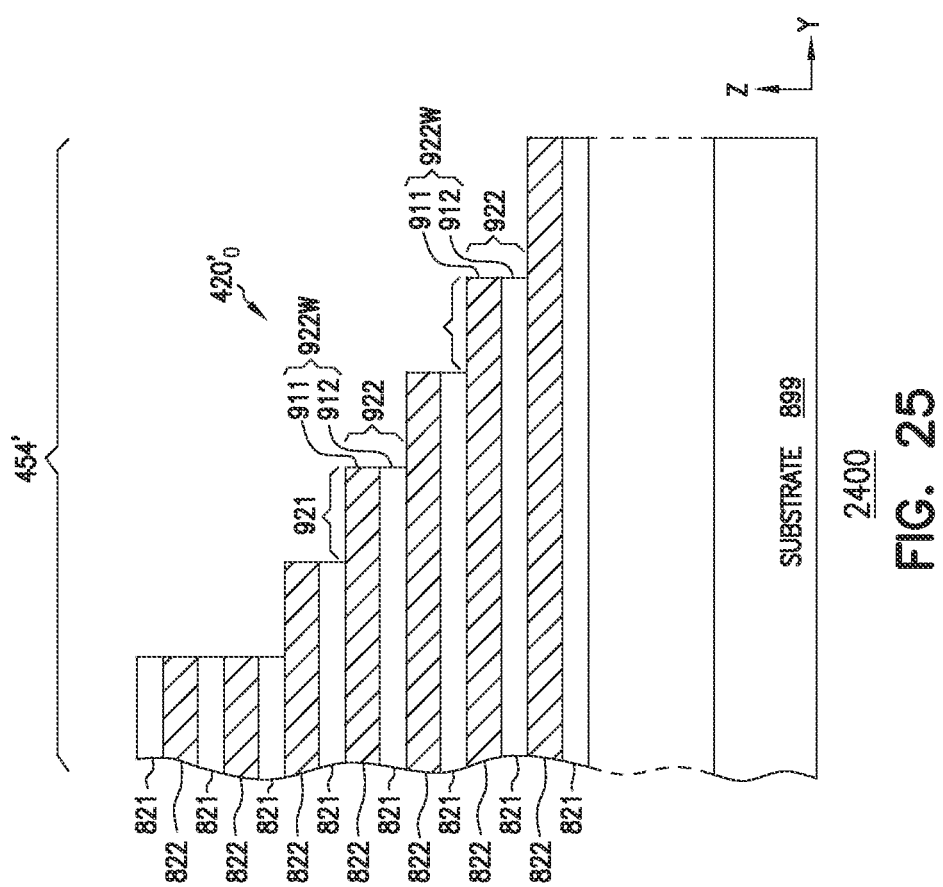

FIG. 25 shows memory device 2400 after staircase structure $420'_0$ is formed in staircase region 454'. Staircase structure $420'_0$ can include regions (e.g., tread regions) 921 and regions (e.g., riser regions) 922. Each region 922 can have a sidewall (e.g., vertical sidewall) 922W.

Figure 26:
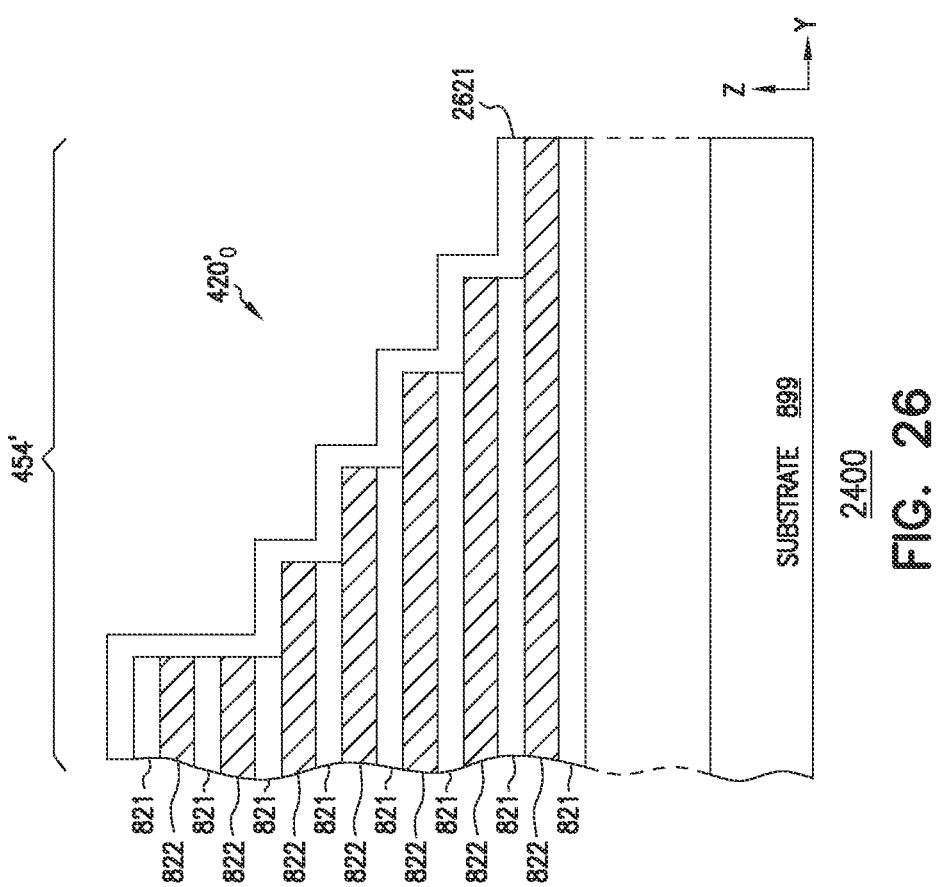

FIG. 26 shows memory device 2400 after a dielectric material (e.g., silicon dioxide) 2621 is formed over regions 921 and regions 922 of staircase structure $420'_0$.

Figure 27:
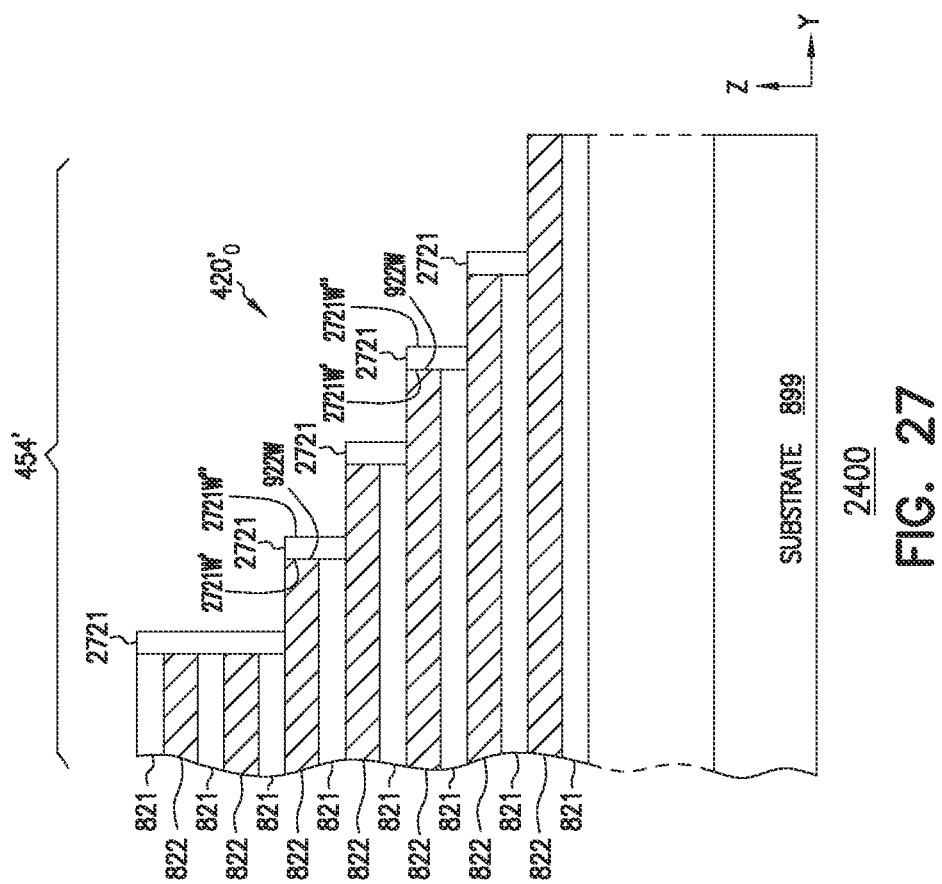

FIG. 27 shows memory device 2400 after a portion of dielectric material 2621 (FIG. 26) is removed. The remaining portions of dielectric material 2621 form dielectric spacers 2721 on respective regions 922 (e.g., on respective sidewalls 922W of regions 922).

As shown in FIG. 27, each dielectric spacer 2721 include sidewalls 2721W' and 2721W''' opposing each other in the Y-direction. Sidewall 2721W' is adjacent (e.g., contacting (or interfacing)) sidewall 922W of a respective region 922.

The following description associated with FIG. 28 through FIG. 34 involves processes of forming polysilicon material 1025 and doped polysilicon material 1125 that are similar to processes of forming polysilicon material 1025 and doped polysilicon material 1125, respectively, in the processes associated with FIG. 10 through FIG. 16. Thus, for simplicity, the description below does not repeat detailed processes of forming polysilicon material 1025 and doped polysilicon material 1125 and elements that are formed involving forming polysilicon material 1025 and doped polysilicon material 1125.

Figure 28:
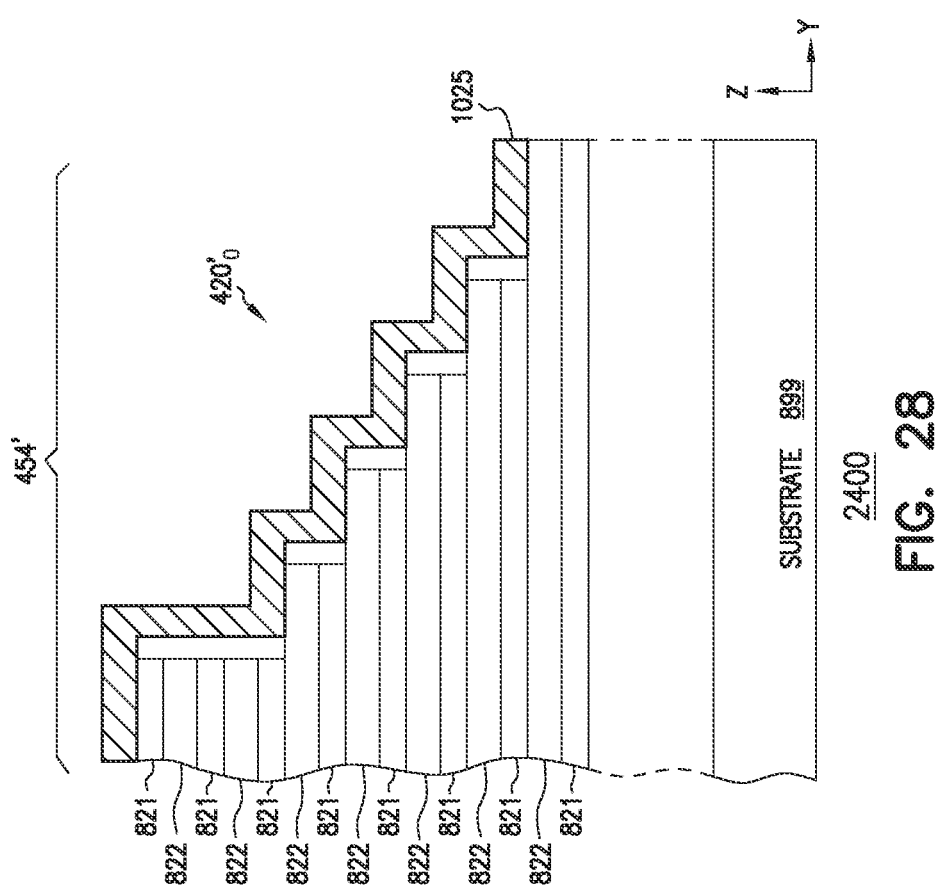

FIG. 28 shows memory device 2400 after a polysilicon material 1025 is formed on regions (e.g., tread regions) 921 of staircase structure $420'_0$ and on dielectric spacers 2721. Thus, polysilicon material 1025 may cover sidewalls 2721W''' of dielectric spacers 2721.

Figure 29:
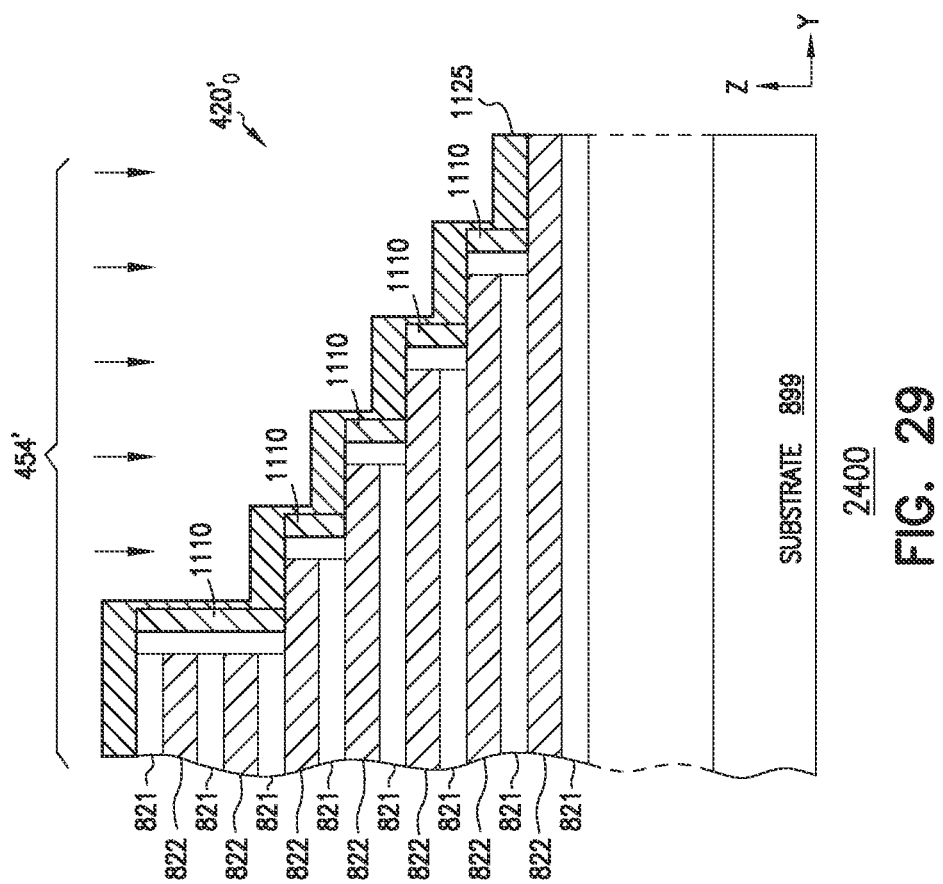

FIG. 29 shows memory device 2400 after a doped polysilicon material 1125 is formed. Forming doped polysilicon material 1125 can include performing a doping process to dope polysilicon material 1025 (FIG. 28) with dopants to form doped polysilicon material 1125 from the combination of polysilicon 1025 and the dopants. The doping process can also form materials 1110 on respective dielectric spacers 2721 (e.g., on sidewalls 2721W'''). Material 1110 can include at least one of undoped polysilicon material (a portion of polysilicon material 1025 in FIG. 28 formed before the doping process in FIG. 11 and remained undoped) and a portion of doped polysilicon (a portion of doped polysilicon material 1125 formed during the doping process associated with FIG. 11).

Figure 30:
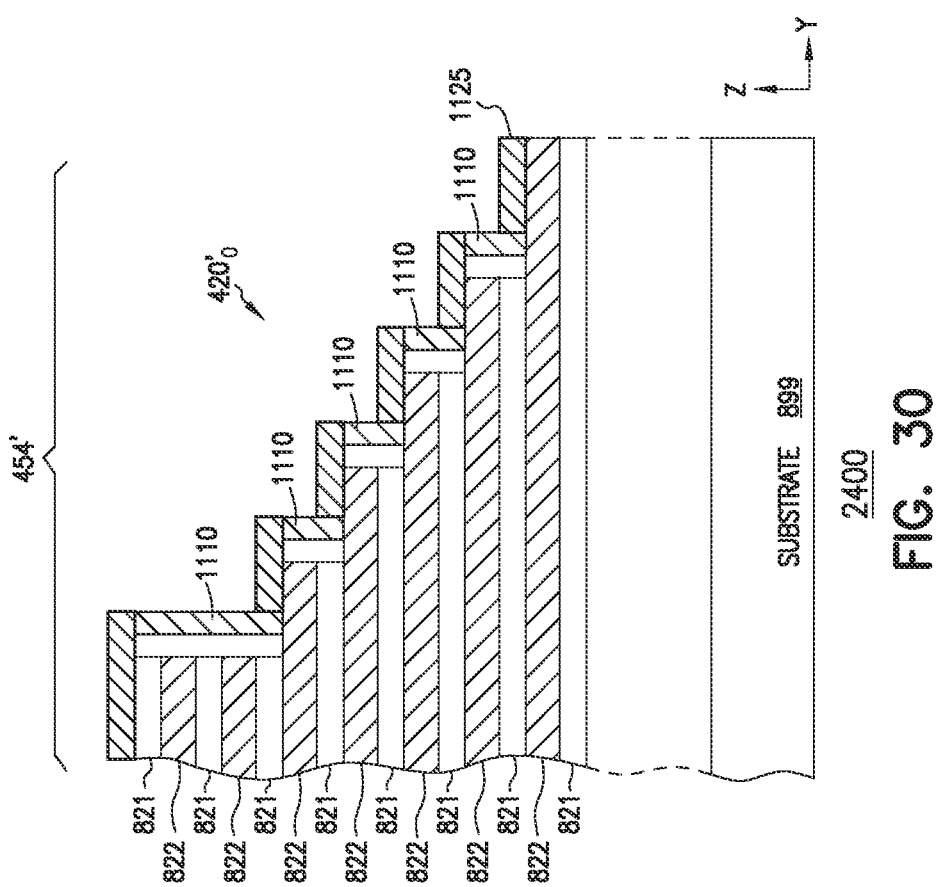

FIG. 30 shows memory device 2400 after part of doped polysilicon material 1125 is removed (e.g., using a decapping process). The removed part of doped polysilicon material 1125 includes an outer part (e.g., part near the surface) of a portion of doped polysilicon material 1125. As shown in FIG. 30, after part (e.g., outer part) of doped polysilicon material 1125 in FIG. 11 was removed, the remaining part (remaining portion) in FIG. 30 of doped polysilicon material 1125 can be thinner than doped polysilicon material 1125 in FIG. 11. The outer part of doped polysilicon material 1125 (that was removed) can include a portion (e.g., vertical portion) of material 1110. As shown in FIG. 30, the remaining portion of material 1110 (e.g., after a decapping process) can be exposed (not covered by doped polysilicon material 1125). The remaining portion of material 1110 may include (e.g., include only) undoped polysilicon material, which are portions of polysilicon material 1025 (formed in FIG. 10) that was not doped during the doping process.

Figure 31:
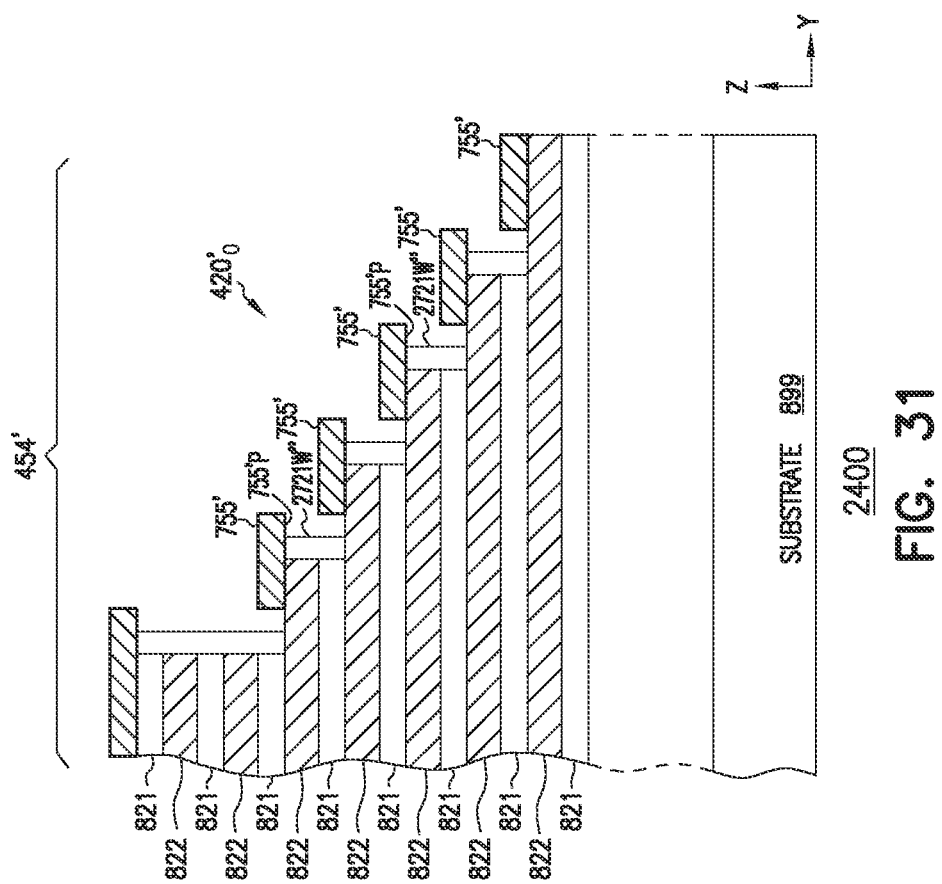

FIG. 31 shows memory device 2400 after conductive pads 755' are formed. Forming conductive pads 755' can include removing materials 1110' (FIG. 30) from respective sidewalls 2721W" of dielectric spacers 2721. Removing materials 1110 can be performed until sidewalls 2721W"' (which were covered by materials 1110) are exposed, such that portions of doped polysilicon material 1125 on regions 921 can be separated (electrically separated) from each other. The separated portions of doped polysilicon material 1125 form conductive pads 755'. As shown in FIG. 31, each conductive pad 755' can include a portion 755'P, which is part of the doped polysilicon material that forms conductive pad 755'. Portion 755'P can extend in the Y-direction past a respective dielectric spacer 2721 (e.g., past sidewall 2721W"' of a respective dielectric spacer 2721), such that portion 755'P can overhang a respective dielectric spacer 2721 (e.g., overhang sidewall 2721W"' of a respective dielectric spacer 2721).

Figure 32:
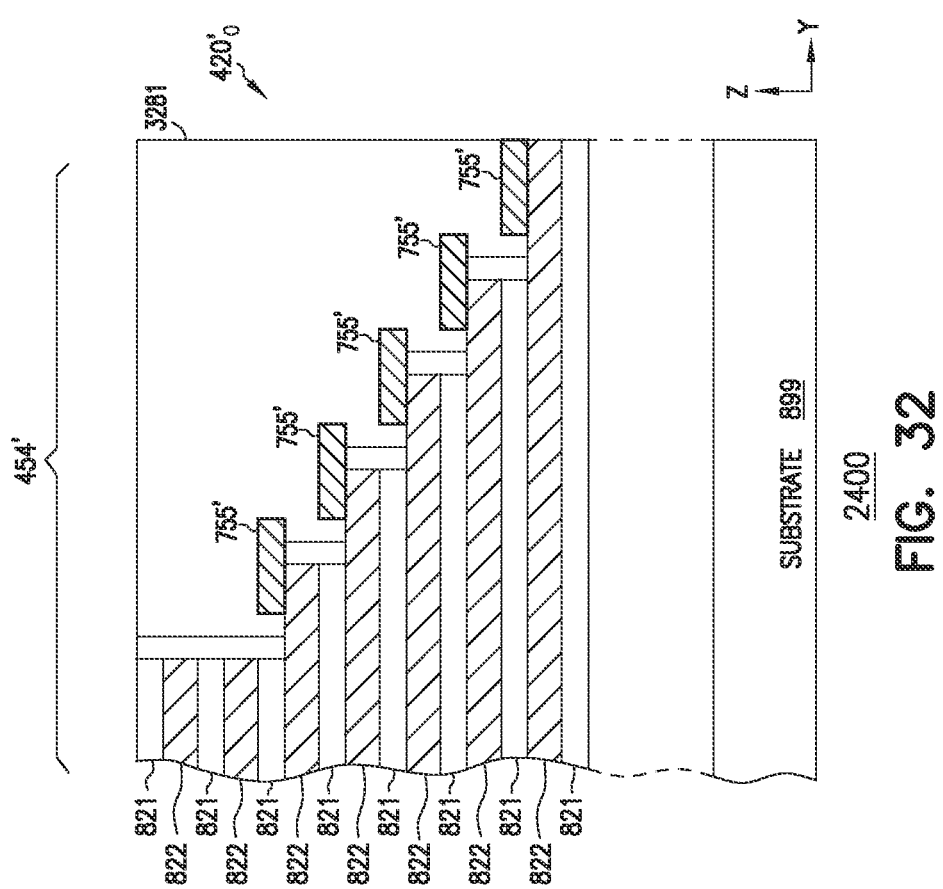

FIG. 32 shows memory device 2400 after a dielectric material (e.g., silicon dioxide) 3281 is formed over conductive pads 755' and over other elements of memory device 2400 at staircase structure $420'_0$.

Figure 33:
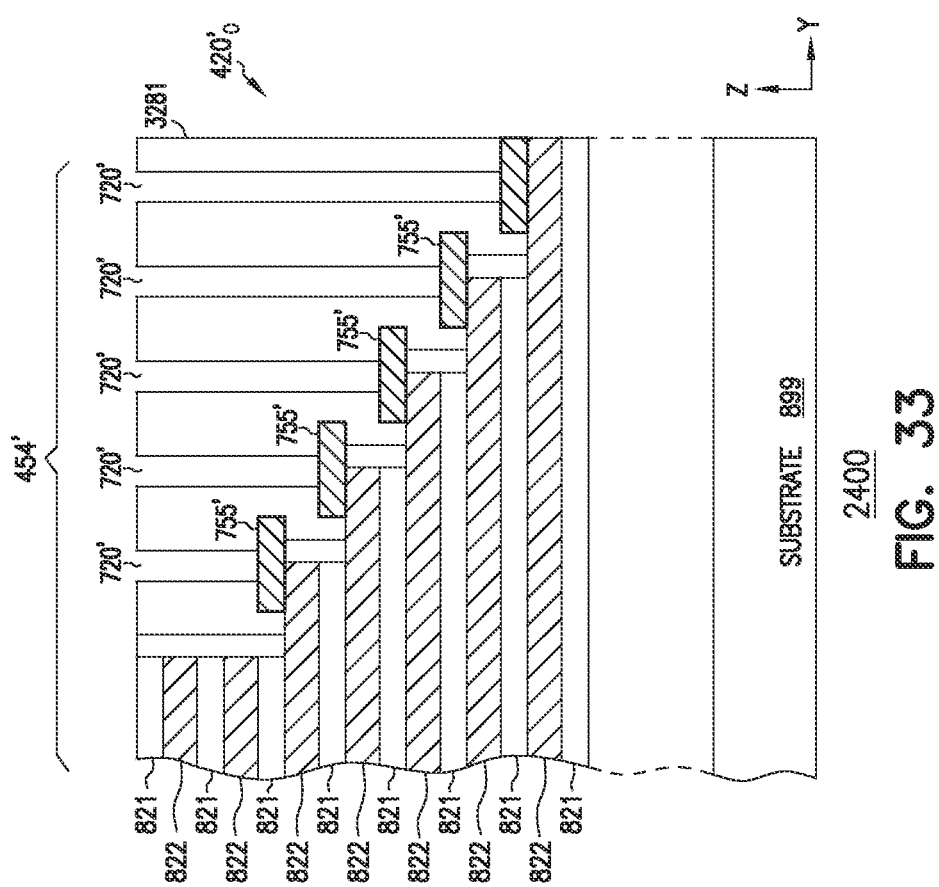

FIG. 33 shows memory device 2400 after openings (e.g., holes) 720' are formed in dielectric material 3281.

Figure 34:
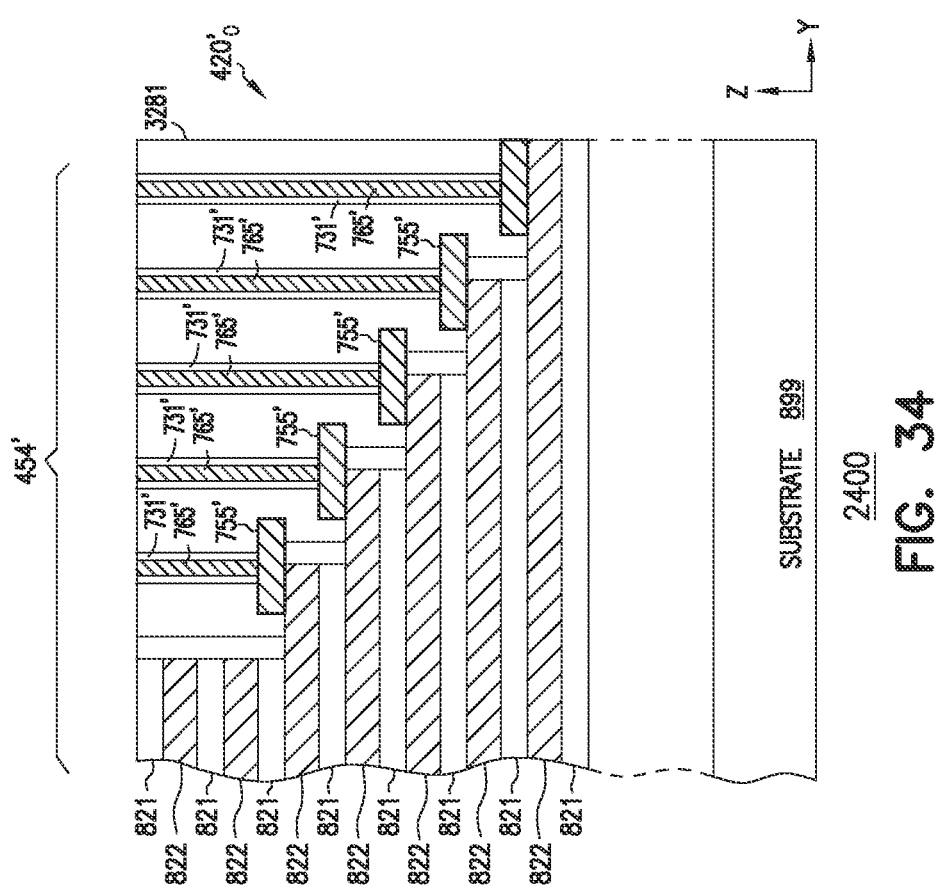

FIG. 34 shows memory device 2400 after dielectric materials (e.g., dielectric liners) 731' and conductive contacts 765' are formed.

The processes of forming memory device 2400 described above with reference to FIG. 24 through FIG. 34 can include other processes to form a complete memory device (e.g., memory device 200). Such processes can be performed before, after, or during the processes of forming dielectric materials 731' and conductive contacts 765'. Such processes are omitted from the above description so as not to obscure the subject matter described herein.

FIG. 35 through FIG. 41 show processes of forming memory device 3500 including forming pillars (FIG. 17), dielectric structures and conductive pads (FIG. 19) at a staircase structure, and control gates (FIG. 21) of memory device 3500, according to some embodiments described herein. Some of the processes of forming memory device 3500 are similar to or the same as those described above for forming memory device 1700 (FIG. 17 through FIG. 23) and memory device 2400 (FIG. 24 through FIG. 34). Memory device 3500 can also include elements (e.g., structures) that are similar to or the same as those of memory device 1700 (FIG. 17 through FIG. 23) and memory device 2400 (FIG. 24 through FIG. 34). For simplicity, detailed description of such processes and elements are not repeated.

Figure 35:
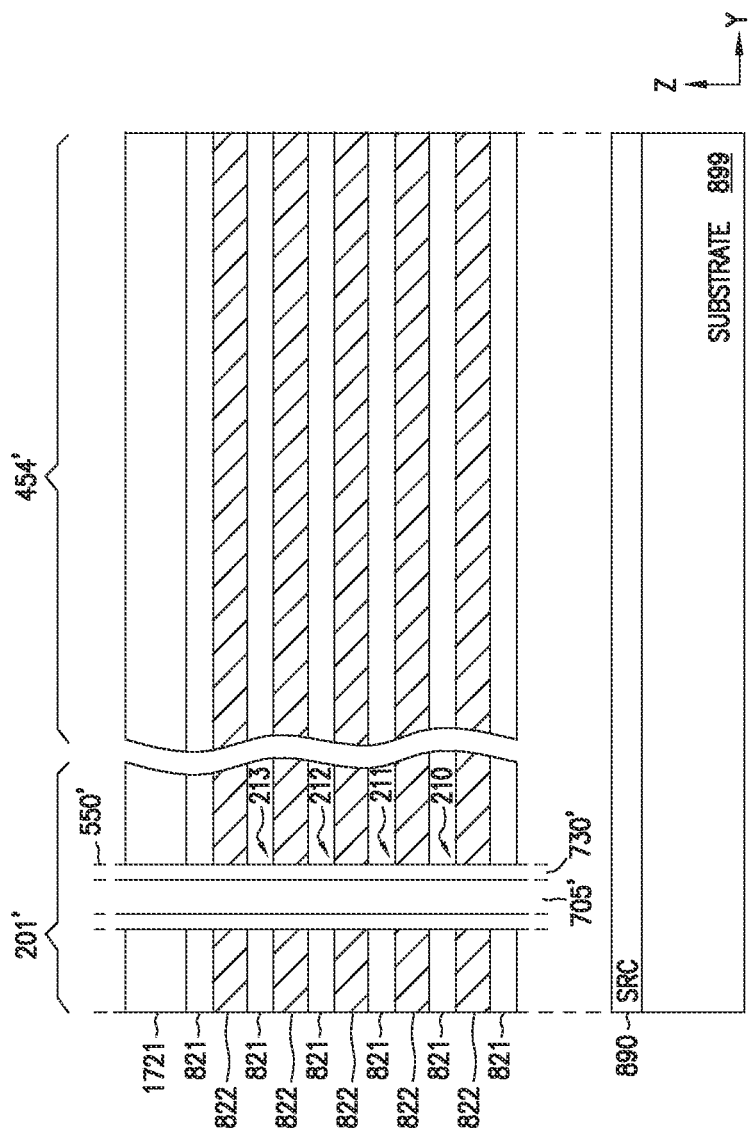

FIG. 35 shows a side view (e.g., cross-section) in the Y-direction of a portion of memory device 3500 that includes a memory array 201', a staircase region 454', source 890, and substrate 899 that are similar to or the same as those of memory device 1700 (FIG. 17). As shown in FIG. 35, pillar 550' can be formed in memory array 201' and formed through the levels of dielectric materials 821 and 822 (which form tiers of memory device 3500). Memory cells 210, 211, 212, and 213 are formed in respective tiers of memory device 3500.

Figure 36:
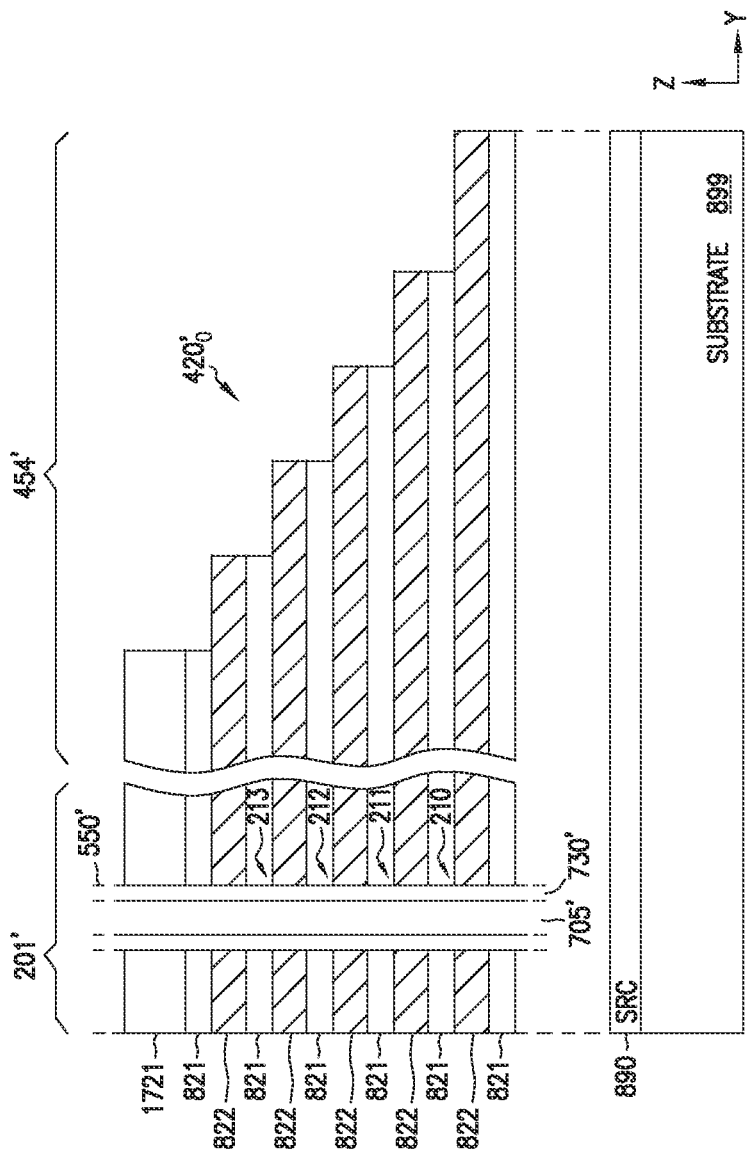

FIG. 36 shows memory device 3500 after staircase structure $420'_0$ is formed. The processes of forming staircase structure $420'_0$ of memory device 3500 are similar to or the same as the processes of forming staircase structure $420'_0$ of memory device 1700 of FIG. 17.

Figure 37:
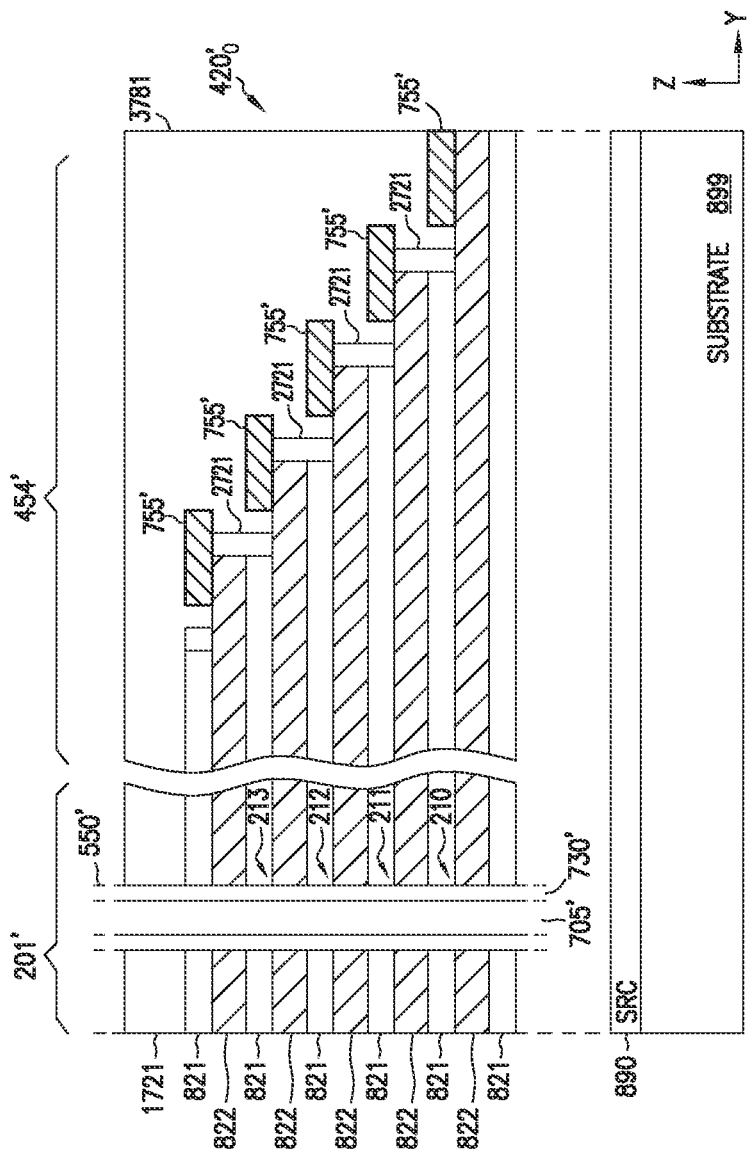

FIG. 37 shows memory device 800 after dielectric spacers 2721, conductive pads 755', and a dielectric material 3781 are formed. The processes of forming dielectric spacers 2721, conductive pads 755', and dielectric material 3781 of memory device 3500 are similar to or the same as the processes of forming dielectric spacers 2721, conductive pads 755', dielectric material 3281, respectively, of memory device 2400 of FIG. 24 through FIG. 34.

Figure 38:
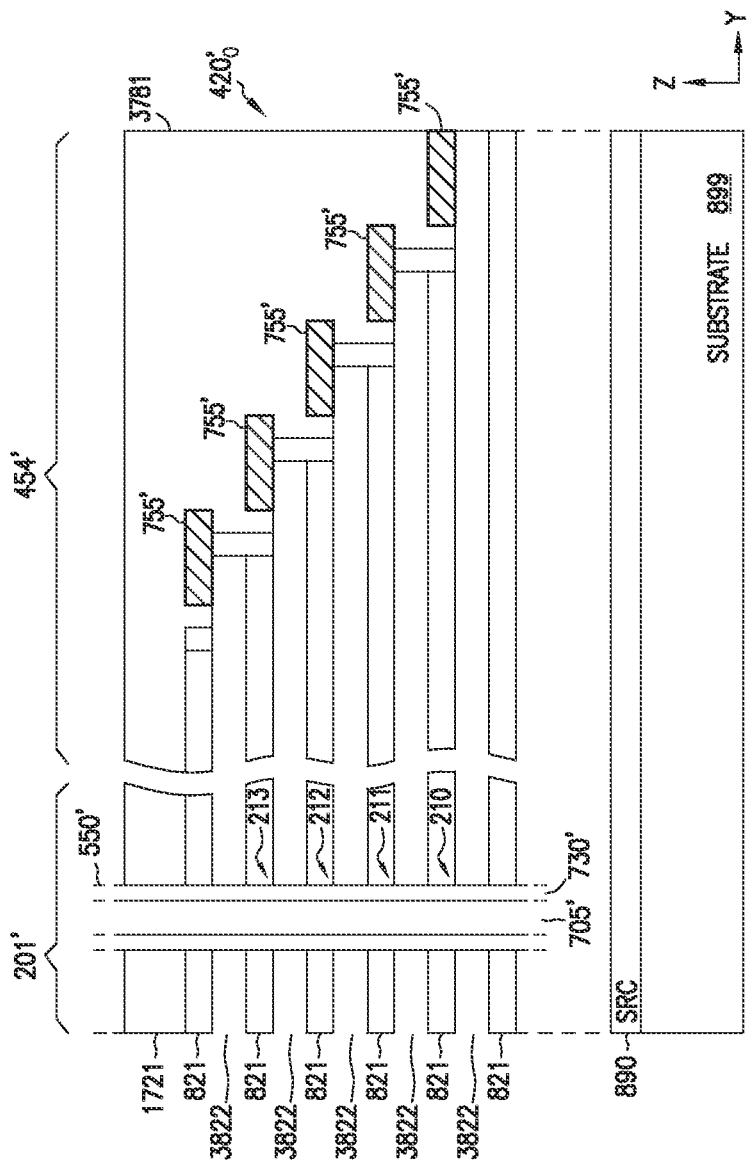

FIG. 38 shows memory device 3500 after dielectric materials 822 are removed (e.g., exhumed) from locations 3822. Locations 3822 in FIG. 38 are voids (empty spaces) that were occupied by dielectric materials 822 in FIG. 37. In subsequent processes, conductive materials can be formed in locations 3822 to form respective control gates of memory device 3500.

Figure 39:
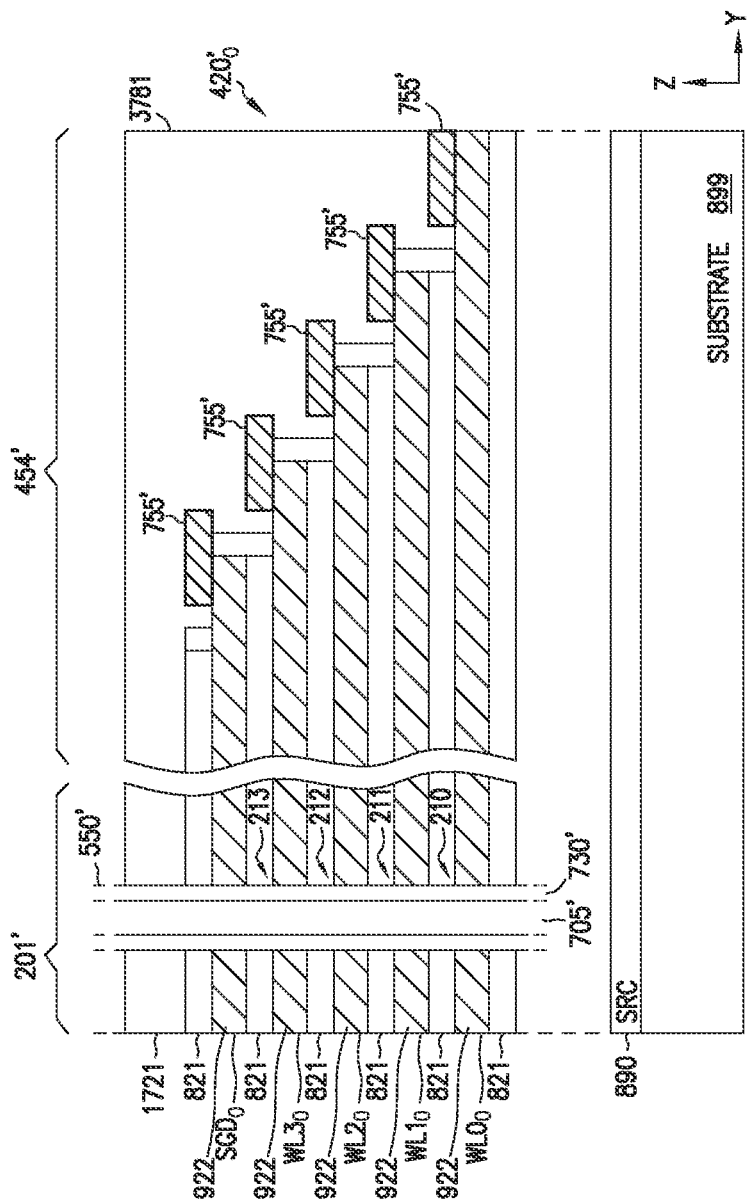

FIG. 39 shows memory device 3500 after materials 3922 are formed (e.g., filled) in locations 3722. Materials 3922 can form respective control gates associated with signals $WL0_0$, $WL1_0$, $WL2_0$, and $WL3_0$, and a select line (e.g., drain select line) associated with signal (e.g., drain select signal) $SGD0_0$. Conductive materials 3922 can have the same material (or materials) as conductive materials 522 (FIG. 7) or conductive materials 2122 (FIG. 21).

Figure 40:
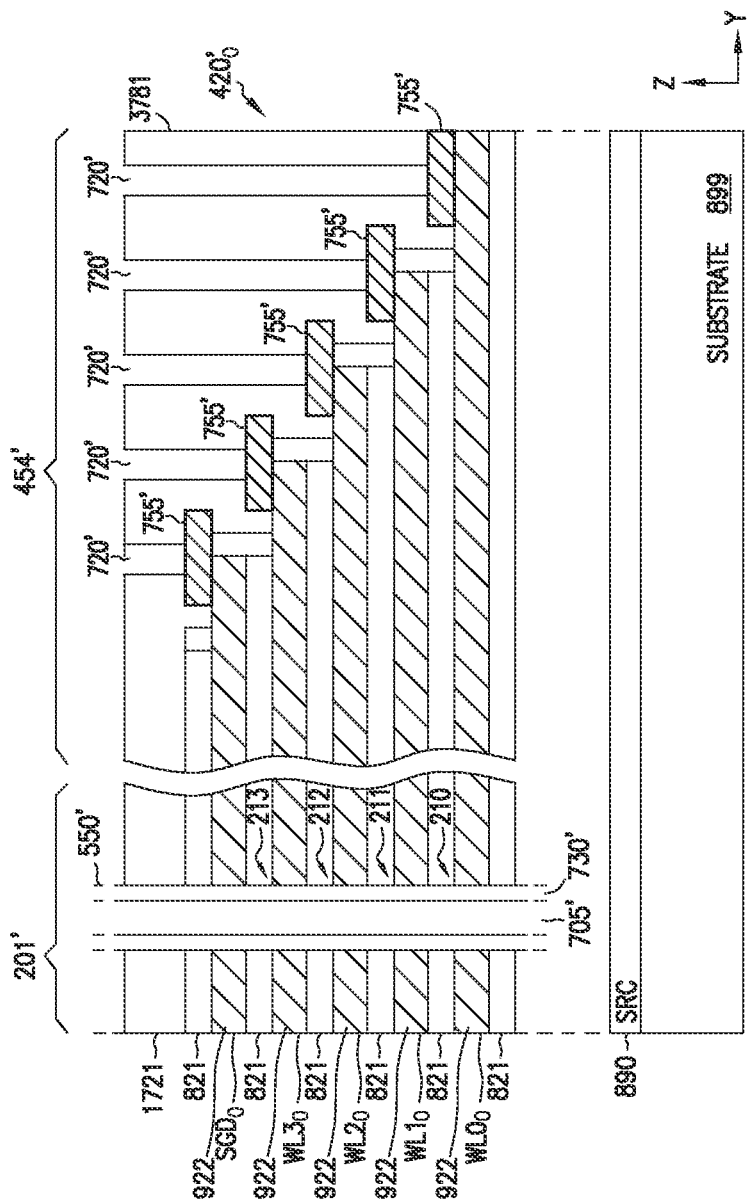

FIG. 40 shows memory device 3500 after openings (e.g., holes) 720' are formed in dielectric material 3781. Forming openings 720' can include removing (e.g., etching) a portion of dielectric material 3781 at the locations of openings 720' to expose conductive pads through respective openings 720'

FIG. 41 shows memory device 3500 after dielectric materials (e.g., dielectric liners) 731' and conductive contacts 765' are formed in openings 720' and contact (e.g., can be electrically coupled to) respective conductive pads 755'.

As shown in FIG. 41, conductive pads 755' can be directly located on (e.g., directly formed on) respective regions (e.g., contact landing regions) of the control gates. Conductive contacts 765' can be directly located on (e.g., directly formed on) respective conductive pads 755' and contact respective control gates through respective conductive pads 755'. Thus, conductive contacts 765' indirectly contact respective control gates. Electrical signals (e.g., signals $WL0_0$, $WL1_0$, $WL2_0$, and $WL3_0$) from conductive paths (not shown) of memory device 3500 can be provided to the control gates through respective conductive contacts 765' and respective conductive pads 755'.

The processes of forming memory device 3500 described above with reference to FIG. 35 through FIG. 41 can include other processes to form a complete memory device (e.g., memory device 200). Such processes are omitted from the above description so as not to obscure the subject matter described herein. Improvements and benefits of memory device 3500 are similar to or the same as improvements and benefits of memory device 1700 described above.

The illustrations of apparatuses (e.g., memory devices 100, 200, 800, 1700, 2400, and 3500) and methods (e.g., method of forming memory device 200, 800, 1700, 2400, and 3500) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 800, 1700, 2400, and 3500) or a system (e.g., a computer, a cellular phone, or other electronic systems) that includes a device such as any of memory devices 100, 200, 800, 1700, 2400, and 3500.

Any of the components described above with reference to FIG. 1 through FIG. 41 can be implemented in a number of ways, including simulation via software. Thus, apparatuses, e.g., memory devices 100, 200, 800, 1700, 2400, and 350, or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, 800, 1700, 2400, and 3500 may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 41 include apparatuses and methods of forming the apparatuses. One of the apparatuses includes a device including tiers of materials located one over another, the tiers of materials including respective memory cells and control gates for the memory cells. The control gates include respective portions that collectively form part of a staircase structure. The staircase structure includes first regions and second regions coupled to the first regions. The second regions include respective sidewalls in which a portion of each of the first regions and a portion of each of the second regions are part of a respective control gate of the control gates. The device also includes conductive pads electrically separated from each other and located on the first regions of the staircase structure, and conductive contacts contacting the conductive pads. Other embodiments including additional apparatuses and methods are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, the terms "first", "second", and "third," etc, are used merely as labels, and are not intended to impose numerical requirements on their objects.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. A method comprising:
   forming levels of first dielectric materials interleaved with levels of second dielectric materials;
   forming a staircase structure from the levels of first dielectric materials and the levels of second dielectric materials, such that the levels of first dielectric materials and the levels of second dielectric materials include respective portions that collectively form the staircase structure, wherein the staircase structure includes first regions and second regions coupled to the first regions, the second regions including respective sidewalls;
   forming a polysilicon material on the first regions and the second regions of the staircase structure;
   doping portions of the polysilicon material on the first regions to form portions of doped polysilicon material on the first regions; and
   removing materials from the second regions to separate the portions of doped polysilicon material on the first regions from each other, wherein the materials include at least portions of the polysilicon material formed on the second regions.

2. The method of claim 1, wherein removing the materials from the second regions includes:
   removing a doped polysilicon material from the second regions in which the doped polysilicon material is formed while the portions of doped polysilicon material are formed on the first regions.

3. The method of claim 1, wherein removing the materials from the second regions is performed until the sidewalls of the second regions are exposed.

4. The method of claim 1, wherein part of each of the portions of doped polysilicon material on the first regions overhangs a respective sidewall of the sidewalls of the second regions.

5. The method of claim 1, wherein doping portions of the polysilicon material includes:
   Implanting dopants into the polysilicon material; and annealing the polysilicon material after implanting the dopants.

6. The method of claim 1, wherein:
the levels of first dielectric materials include silicon nitride; and
the levels of second dielectric materials include silicon dioxide.

7. A method comprising:
forming levels of first dielectric materials interleaved with levels of second dielectric materials;
forming a staircase structure from the levels of first dielectric materials and the levels of second dielectric materials, such that the levels of first dielectric materials and the levels of second dielectric materials include respective portions that collectively form the staircase structure, wherein the staircase structure includes first regions and second regions coupled to the first regions, the second regions including respective sidewalls;
forming dielectric spacers on sidewalls of the second regions;
forming a polysilicon material on the first regions and on the dielectric spacers;
doping the poly silicon material to form doped poly silicon material; and
removing materials from respective sidewalls of the dielectric spacers to separate at least part of the doped polysilicon material into portions of doped polysilicon material on the first regions, wherein the materials include at least portions of the polysilicon material on the dielectric spacers.

8. The method of claim 7, further comprising:
removing an outer part of the doped polysilicon material before removing the materials from the respective sidewalls of the dielectric spacers to obtain a remaining part of the doped polysilicon material, wherein the remaining part of the doped polysilicon material includes the part of the doped polysilicon material being separated into portions of doped polysilicon material on the first regions.

9. The method of claim 7, wherein removing materials from respective sidewalls of the dielectric spacers is performed until the respective sidewalls of the dielectric spacers are exposed.

10. The method of claim 7, wherein part of each of the portions of doped polysilicon material on the first regions overhangs a respective sidewall of the sidewalls of the dielectric spacers.

11. The method of claim 7, wherein removing materials from respective sidewalls of the dielectric spacers includes:
performing an anisotropic etch to remove the materials from respective sidewalls of the dielectric spacers.

12. A method comprising:
forming levels of first dielectric materials interleaved with levels of second dielectric materials;
forming a memory cell string including forming a pillar of the memory cell strings through the levels of first materials and the levels of second dielectric materials;
forming a staircase structure from the levels of first dielectric materials and the levels of second dielectric materials, such that the levels of first dielectric materials and the levels of second dielectric materials include respective portions that collectively form the staircase structure, wherein the staircase structure includes first regions and second regions coupled to the first regions, the second regions including respective sidewalls, wherein a portion of each of the first regions and a portion of each of the second regions are part of a level of first material of the levels of first dielectric materials;
forming a polysilicon material on the first regions and the second regions of the staircase structure;
doping portions of the polysilicon material formed on the first regions to form portions of doped polysilicon material on the first regions;
removing portions of the polysilicon from the second regions to separate the portions of doped polysilicon material on the first regions from each other, the portions of doped polysilicon material forming respective conductive pads; and
replacing the levels of first dielectric materials with respective levels of conductive materials, such that the levels of conductive materials contact the conductive pads.

13. The method of claim 12, wherein replacing the levels of first dielectric materials with respective levels of conductive materials includes:
removing the levels of first dielectric materials to form voids at locations of the levels of first dielectric materials before the levels of first dielectric materials are removed; and
forming the levels of conductive materials in the voids.

14. The method of claim 12, wherein:
the levels of first dielectric materials include silicon nitride; and
the levels of second dielectric materials include silicon dioxide.

15. The method of claim 12, wherein the conductive materials include metal.

16. The method of claim 12, further comprising:
forming conductive contacts on the conductive pads.

* * * * *